(12) United States Patent  
Saito et al.

(10) Patent No.: US 9,331,713 B2
(45) Date of Patent: May 3, 2016

(54) ENCODING APPARATUS, CONTROL METHOD OF ENCODING APPARATUS, AND MEMORY DEVICE

(75) Inventors: Yoshiki Saito, Kanagawa (JP); Shinichi Kanno, Tokyo (JP); Toshikatsu Hida, Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 13/600,929

(22) Filed: Aug. 31, 2012

(65) Prior Publication Data

US 2013/0254637 A1  Sep. 26, 2013

(30) Foreign Application Priority Data

Mar. 22, 2012 (JP) .................................. 2012-066197

(51) Int. Cl.
 *H03M 13/05* (2006.01)
 *H03M 13/00* (2006.01)
(52) U.S. Cl.
 CPC .......... *H03M 13/05* (2013.01); *H03M 13/6516* (2013.01)
(58) Field of Classification Search
 CPC .............. H03M 13/151; H03M 13/15; H03M 13/1515; H03M 13/116; H03M 13/1111; H03M 13/1137; H03M 13/05; H03M 13/6516; G11B 20/1833; H04L 1/0057; H04L 1/0041
 USPC ............................ 714/763, 785, 782, E11.032
 See application file for complete search history.

(56) References Cited

U.S. PATENT DOCUMENTS

| 5,365,529 A * | 11/1994 | Mester ......................... 714/784 |
| 6,031,875 A * | 2/2000 | Im ................................. 375/262 |
| 6,260,169 B1 * | 7/2001 | Massoudi ..................... 714/769 |
| 6,684,363 B1 * | 1/2004 | Cassiday et al. ............. 714/776 |
| 7,900,117 B2 | 3/2011 | Kanno |
| 2007/0025235 A1* | 2/2007 | Rasmussen et al. .......... 370/208 |
| 2007/0198902 A1* | 8/2007 | Toda ............................. 714/782 |

(Continued)

FOREIGN PATENT DOCUMENTS

| JP | 57-20042 | 2/1982 |
| JP | 64-26240 | 1/1989 |

(Continued)

OTHER PUBLICATIONS

Japanese Office Action mailed on Apr. 22, 2014 in corresponding Japanese Patent application No. 2012-066197 with English translation, citing documents AA, AO, AP, AQ, AR, AS, and AT therein.

*Primary Examiner* — Albert Decady
*Assistant Examiner* — Kyle Vallecillo
(74) *Attorney, Agent, or Firm* — Oblon, McClelland, Maier & Neustadt, L.L.P.

(57) ABSTRACT

According to an embodiment, an encoding apparatus includes a parameter holding unit configured to hold a parameter; an error-detecting code holding unit configured to hold an error-detecting code that is generated from the parameter; an error detecting unit configured to detect an error in the parameter, which is held in the parameter holding unit, with the use of the error-detecting code held in the error-detecting code holding unit; an error correcting unit configured to correct the error detected by the error detecting unit; a selecting unit configured to select the parameter that has been subjected to error correction by the error correcting unit; and an encoding unit configured to encode data with the use of the parameter selected by the selecting unit.

9 Claims, 21 Drawing Sheets

(56) References Cited

U.S. PATENT DOCUMENTS

| | | |
|---|---|---|
| 2009/0049366 A1* | 2/2009 | Toda .................. 714/782 |
| 2009/0183052 A1 | 7/2009 | Kanno et al. |
| 2009/0249138 A1* | 10/2009 | Liu et al. .............. 714/718 |
| 2009/0319864 A1 | 12/2009 | Shrader |
| 2011/0239083 A1 | 9/2011 | Kanno |
| 2013/0179750 A1 | 7/2013 | Hida et al. |
| 2013/0191705 A1 | 7/2013 | Watanabe et al. |
| 2013/0305120 A1 | 11/2013 | Torii et al. |

FOREIGN PATENT DOCUMENTS

| | | |
|---|---|---|
| JP | 3661089 | 4/2005 |
| JP | 3898682 | 1/2007 |
| JP | 3953397 | 5/2007 |
| JP | 2008-134736 | 6/2008 |
| JP | 2011-109476 | 6/2011 |
| TW | 201237622 A1 | 9/2012 |
| TW | 201246216 A1 | 11/2012 |
| TW | 201306041 A1 | 2/2013 |
| WO | WO 2013/014974 A1 | 1/2013 |

* cited by examiner

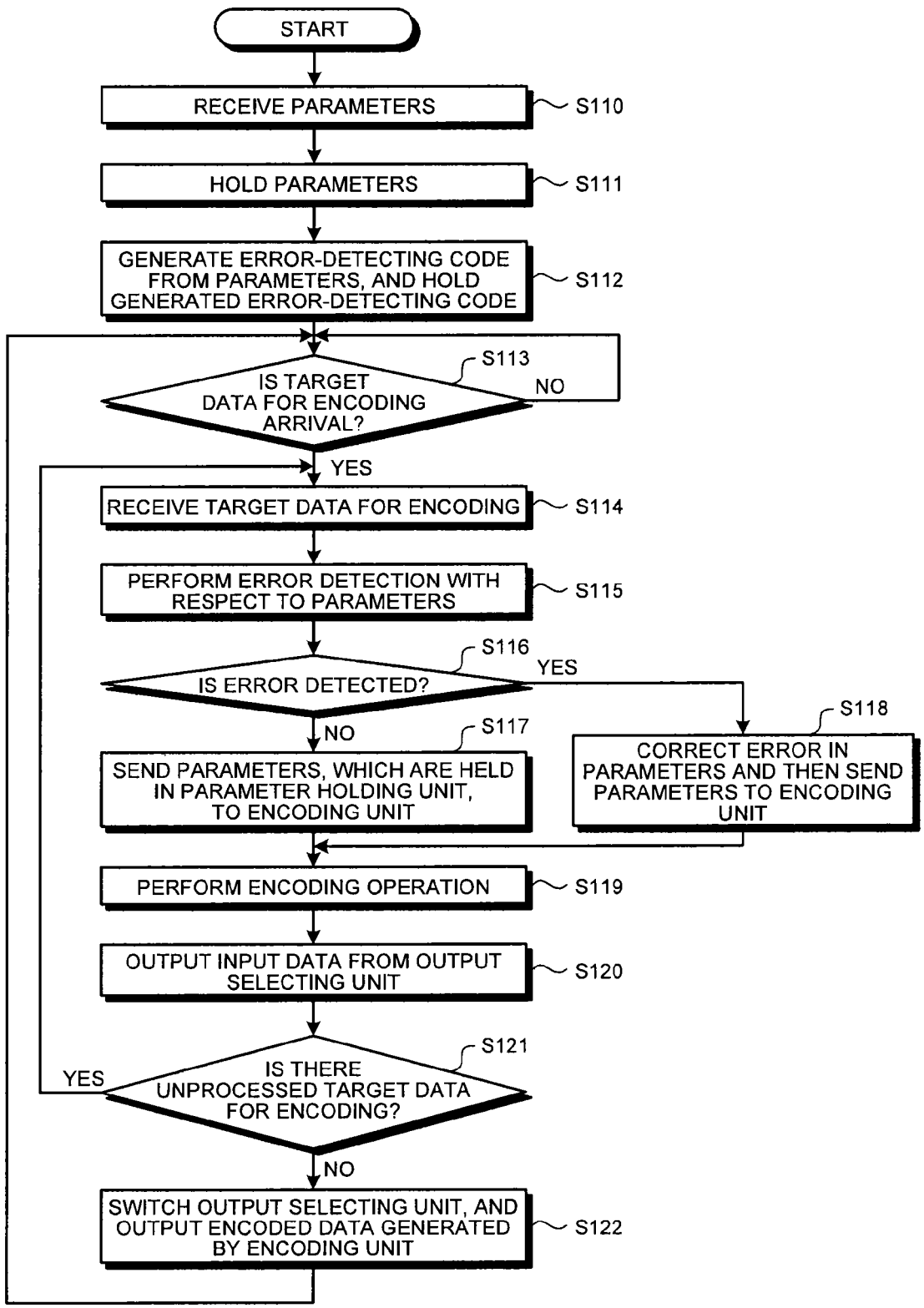

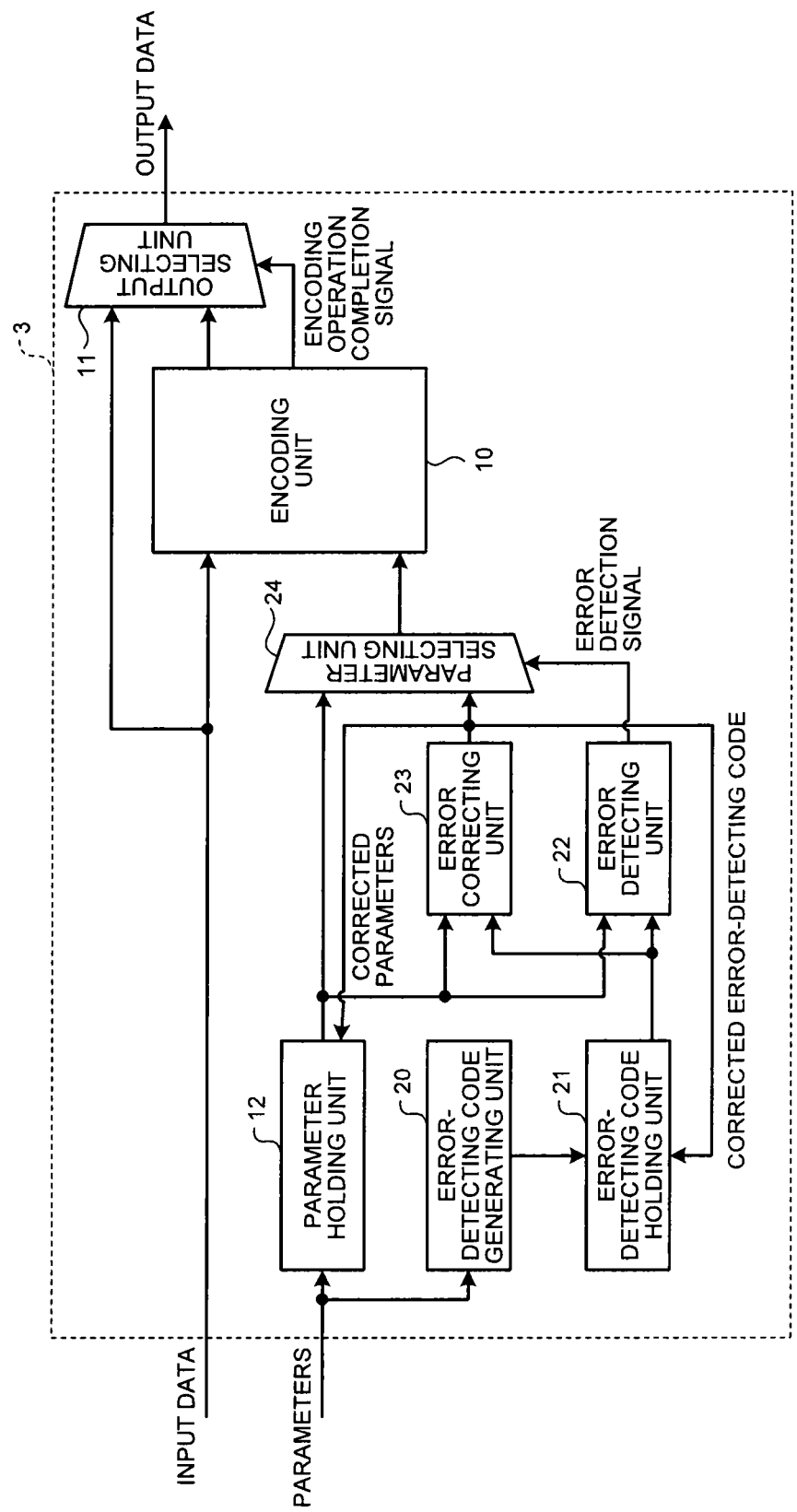

ENCODING APPARATUS, CONTROL METHOD OF ENCODING APPARATUS, AND MEMORY DEVICE

CROSS-REFERENCE TO RELATED APPLICATION(S)

This application is based upon and claims the benefit of priority from Japanese Patent Application No. 2012-066197, filed on Mar. 22, 2012; the entire contents of which are incorporated herein by reference.

FIELD

Embodiments described herein relate generally to an encoding apparatus, a control method of the encoding apparatus, and a memory device.

BACKGROUND

In various fields related to information processing such as memories, wireless communication, satellite broadcasting, and optical disks, encoding techniques having error detection and error correction capability are implemented with the aim of enhancing the reliability of the entire system. Known encoding techniques include Reed Solomon encoding, BCH (Bose-Chaudhuri-Hocquenghem) encoding, convolutional encoding, and LDPC (Low-Density Parity-Check) encoding. For example, in a memory system in which a semiconductor memory is used, minimizing and stacking techniques in the semiconductor fabricating have led to a significant rate of occurrence of errors. In that regard, encoding techniques such as those mentioned above are implemented so as to enhance the reliability of the entire memory system.

In an encoding apparatus that performs encoding, registers can be disposed with the purpose of holding parameters that determine the characteristic features such as the error correction capability of the encoding apparatus. Such a configuration makes it possible to easily provide an encoding apparatus that is tailored to the required characteristic features.

However, in the case of disposing registers with the aim of holding parameters that determine the characteristic features of the encoding apparatus, if a soft error occurs in the registers thereby causing a change in the values of parameters held therein, then an error occurs during the encoding operation and the system starts malfunctioning.

BRIEF DESCRIPTION OF THE DRAWINGS

FIG. 4A is a flowchart for explaining exemplary operations performed in the encoding apparatus according to the first embodiment;

FIG. 5 is a block diagram illustrating an exemplary configuration of an encoding apparatus according to a second embodiment;

DETAILED DESCRIPTION

According to an embodiment, an encoding apparatus includes a parameter holding unit configured to hold a parameter; an error-detecting code holding unit configured to hold an error-detecting code that is generated from the parameter; an error detecting unit configured to detect an error in the parameter, which is held in the parameter holding unit, with the use of the error-detecting code held in the error-detecting code holding unit; an error correcting unit configured to correct the error detected by the error detecting unit; a selecting unit configured to select the parameter that has been subjected to error correction by the error correcting unit; and an encoding unit configured to encode data with the use of the parameter selected by the selecting unit.

Figure 1:
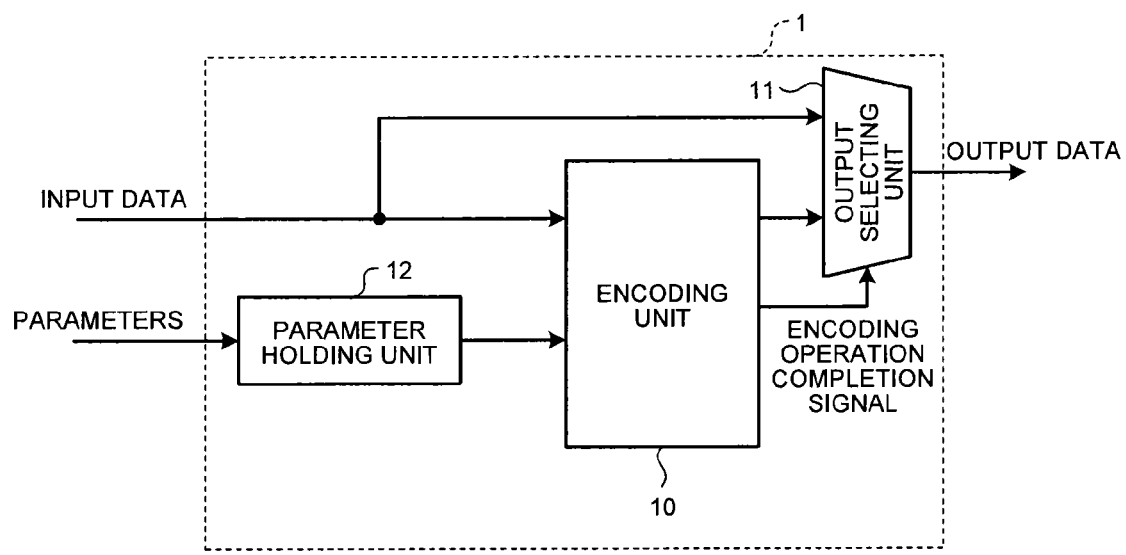
FIG. 1 is a block diagram illustrating an exemplary encoding apparatus having a known configuration.

Given below is the explanation of an encoding apparatus according to each embodiment. To facilitate the understanding, firstly, the explanation is given regarding an encoding apparatus that serves as a premise for each embodiment. FIG. 1 illustrates an encoding apparatus 1 that has a known configuration and that serves as a premise for each embodiment.

The encoding apparatus 1 includes an encoding unit 10, an output selecting unit 11, and a parameter holding unit 12.

In the encoding apparatus 1, the encoding unit 10 encodes input data, which is the target data for encoding, in predetermined units with the use of the parameters held in the parameter holding unit 12, and then outputs the encoded data. Herein, the parameters are values that determine the characteristic features of an encoding operation performed by the encoding unit 10. The characteristic features of the encoding operation include the operations performed during the encoding operation. The encoded data that is obtained by encoding the input data by the encoding unit 10 is output by the encoding apparatus 1 as output data.

The encoding unit 10 encodes the input data using, for example, a generating polynomial. In this case, the parameters are values that represent the generating polynomial. As an example, the coefficient of each degree in the generating polynomial can be used as a parameter. By changing the parameters used by the encoding unit 10, it becomes possible to change the characteristic features such as the encoding capability of the encoding unit 10.

More specifically, for example, the parameters used by the encoding unit 10 during the encoding operation are received from outside and are held in, such as the parameter holding unit 12 that is configured with registers. The input data that is the target data for encoding is input not only to the encoding unit 10 but also to a first selection input terminal of two selection input terminals of the output selecting unit 11. The output from the encoding unit 10 is input to a second selection input terminal of the output selecting unit 11. According to an encoding operation completion signal that is sent by the encoding unit 10, switchover is done between the first selection input terminal and the second selection input terminal of the output selecting unit 11.

Figure 2:
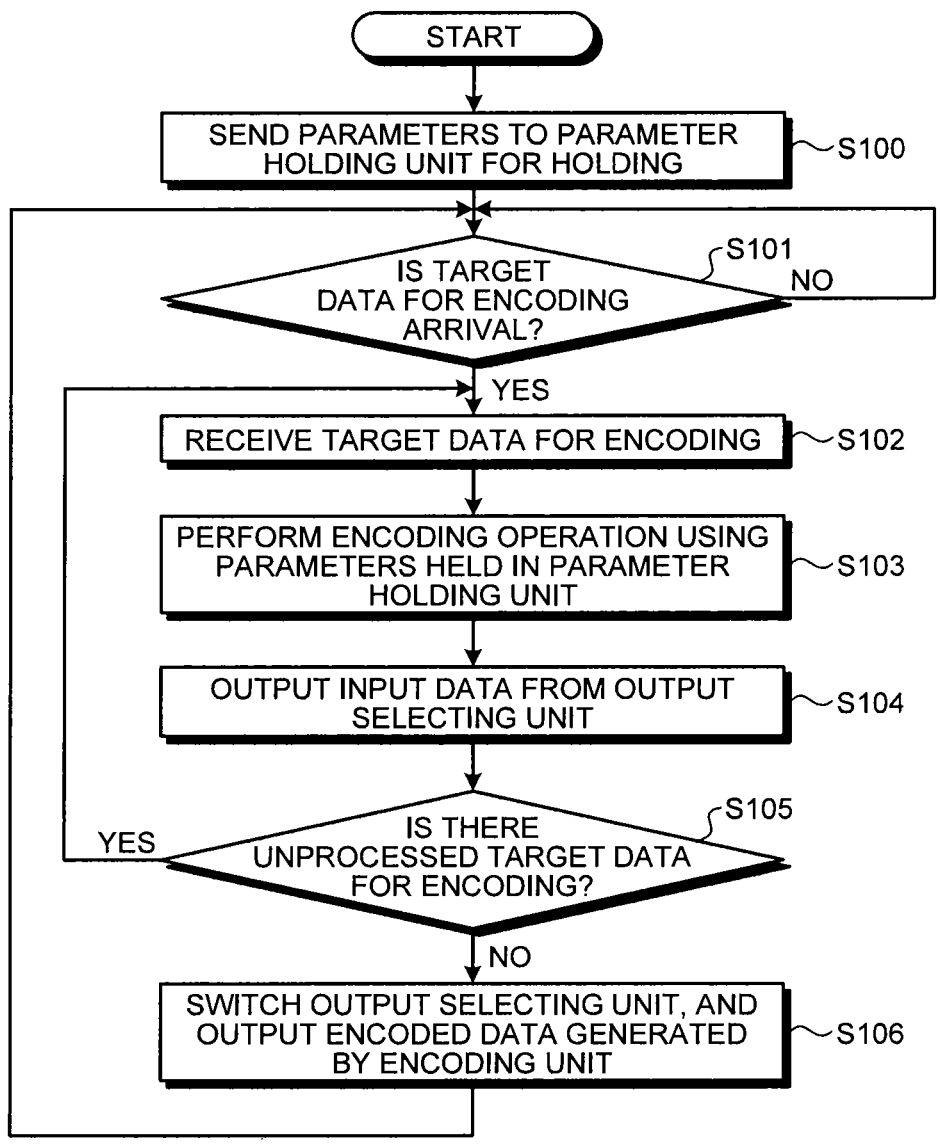
FIG. 2 is a flowchart for explaining exemplary operations performed in the encoding apparatus having the known configuration.

FIG. 2 is a flowchart for explaining exemplary operations performed in the encoding apparatus 1. When the encoding apparatus 1 is switched ON, the parameters that are received from, for example, outside are held in the parameter holding unit 12 (Step S100). Then, the encoding apparatus 1 waits for the arrival of input data that is the target data for encoding (Step S101). Upon receiving the target data for encoding, the encoding apparatus 1 sends the received target data to the encoding unit 10 as well as to the first selection input terminal of the output selecting unit 11 (Step S102).

Upon receiving the target data for encoding, the encoding unit 10 encodes that target data for encoding with the use of the parameters held in the parameter holding unit 12 (Step S103). Meanwhile, at this stage, in the output selecting unit 11, the first selection input terminal is selected; and the target data for encoding is output without modification as output data (Step S104).

Subsequently, the encoding apparatus 1 determines whether or not any target data for encoding still remains unprocessed, that is, determines whether or not the encoding unit 10 has encoded a predetermined volume of target data for encoding (Step S105). If it is determined that a predetermined volume of target data for encoding is not yet encoded and there still remains some target data for encoding (Yes at Step S105), then the system control returns to Step S102 and the operations are repeated with respect to the remaining target data for encoding.

On the other hand, if it is determined that a predetermined volume of target data for encoding has been encoded and no target data for encoding remains unprocessed (No at Step S105), then the system control proceeds to Step S106. Subsequently, the encoding unit 10 outputs an encoding operation completion signal, which indicates that a predetermined volume of target data for encoding has been encoded, to the output selecting unit 11. In accordance with the encoding operation completion signal, the output selecting unit 11 switches the input terminal from the first selection input terminal to the second selection input terminal and outputs the encoded data, which is obtained as a result of encoding performed by the encoding unit 10 with respect to the target data for encoding, as output data (Step S106). Then, the system control returns to Step S101.

In this way, during the encoding operation performed in the encoding apparatus 1, the encoded data that is obtained as a result of encoding of the target data for encoding is output along with the target data for encoding.

In such a configuration, while the parameter holding unit 12 is holding the parameters, in case a soft error occurs in the parameter holding unit 12 due to, for example, the effect of secondary cosmic rays, the parameters used by the encoding unit 10 undergo changes from the desired values. Consequently, the encoding unit 10 performs a different encoding operation than the desired encoding operation. As a result, correct encoded data cannot be obtained.

In that regard, in the embodiments, with the aim of preventing the encoding unit 10 from malfunctioning due to a soft error, error detection and error correction are performed with respect to the parameters held in the parameter holding unit 12.

First Embodiment

Figure 3:
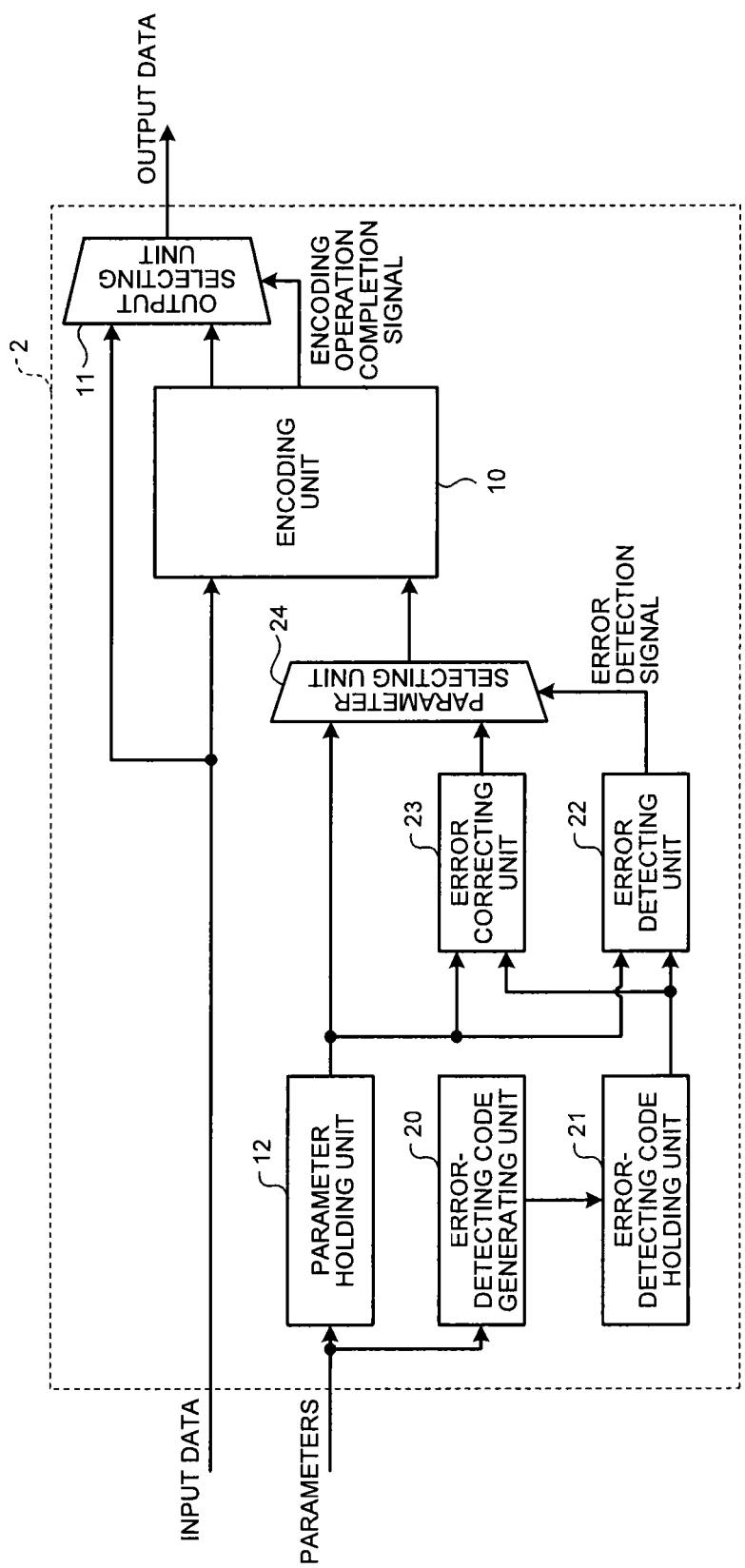
FIG. 3 illustrates an exemplary configuration of an encoding apparatus according to a first embodiment.

Given below is the explanation of the first embodiment. FIG. 3 illustrates an exemplary configuration of an encoding apparatus 2 according to the first embodiment. With reference to FIG. 3, the constituent elements identical to those illustrated in FIG. 1 are referred to by the same reference numerals, and the detailed explanation thereof is not repeated. In an identical manner to the encoding apparatus 1 illustrated in FIG. 1, the encoding apparatus 2 includes the encoding unit 10, the output selecting unit 11, and the parameter holding unit 12. In addition, the encoding apparatus 2 also includes an error-detecting code generating unit 20, an error-detecting code holding unit 21, an error detecting unit 22, an error correcting unit 23, and a parameter selecting unit 24.

The parameters, which determine the characteristic features of the encoding operation performed by the encoding unit 10, are sent to and held in the parameter holding unit 12 as well as sent to the error-detecting code generating unit 20. Based on those parameters, the error-detecting code generating unit 20 generates an error-detecting code that is capable of at least detecting errors in the parameters. Alternatively, the error-detecting code generating unit 20 can also generate an error-detecting/error-correcting code that is not only capable of detecting errors in the parameters but also capable of correcting those errors.

As the error-detecting code generated by the error-detecting code generating unit 20, it is possible to use, for example, the parity bit or the CRC (cyclic redundancy check) code. Moreover, as the error-detecting/error-correcting code that is capable of correcting errors, it is possible to use, for example, a Reed-Solomon code, a BCH (Bose-Chaudhuri-Hocquenghem) code, or a hamming code. Herein, it is assumed that the error-detecting code generating unit 20 generates the BCH code. Meanwhile, in the following explanation, unless otherwise specified, the error-detecting code and the error-detecting/error-correcting code are referred to collectively as the error-detecting code.

The error-detecting code generated by the error-detecting code generating unit 20 is held in the error-detecting code holding unit 21 that is configured with, for example, registers.

The error detecting unit 22 detects errors in parameters with the use of the parameters held in the parameter holding unit 12 and with the use of the error-detecting code held in the error-detecting code holding unit 21. In this example in which the BCH code is used as the error-detecting code, the error detecting unit 22 performs syndrome calculation with the use of the error-detecting code held in the error-detecting code holding unit 21 and with the use of the parameters held in the parameter holding unit 12. Then, if all values of the calculated syndrome are "0", the error detecting unit 22 determines that neither the parameters nor the error-detecting code has any error. On the other hand, if even one of the values of the calculated syndrome is not "0", the error detecting unit 22 determines that at least either the parameters have an error or the error-detecting code has an error. Then, the error detecting unit 22 outputs the error detection result in the form of an error detection signal to the parameter selecting unit 24.

The error correcting unit 23 corrects errors in parameters with the use of the parameters held in the parameter holding unit 12 and with the use of the error-detecting code held in the error-detecting code holding unit 21. In this example in which the BCH code is used as the error-detecting code, the error correcting unit 23 performs syndrome calculation with the use of the error-detecting code held in the error-detecting code holding unit 21 and with the use of the parameters held in the parameter holding unit 12. Alternatively, the error correcting unit 23 can receive the result of syndrome calculation from the error detecting unit 22. Then, based on the values of the calculated syndrome, the error correcting unit 23 identifies an error position in the parameters and performs error correction by inverting the bit value at the error position.

The parameter selecting unit 24 receives, at the first selection input terminal thereof, input of the output from the parameter holding unit 12 and receives, at the second selection input terminal thereof, the output of error correction performed by the error correcting unit 23. Then, depending on the error detection signal sent by the error detecting unit 22, the parameter selecting unit 24 selects one of the two selection input terminals. The output of the parameter selecting unit 24 is sent to the encoding unit 10.

Meanwhile, the encoding unit 10 can be configured to perform encoding using, for example, a generating polynomial G(x). As an example, the encoding unit 10 includes registers that are equal in number to the maximal degree of the generating polynomial G(x), and has XOR (exclusive OR) circuits disposed at the input of the registers of such degrees of the generating polynomial G(x) that have "1" as the coefficient. In each XOR circuit, the output of the corresponding register is provided to one input, while the input data is provided to the other input. To each register having the degree coefficient "1" is input the result of XOR performed with the output of the register immediately before the register having the degree coefficient "1". The input data is circulated to each register and each XOR circuit by following, for example, a clock. From each register, encoding output is retrieved.

In such a configuration, the coefficient of each degree of the generating polynomial G(x) serves as a parameter for determining the characteristic features of the encoding unit 10. For example, an XOR circuit is disposed with respect to the input of each register in the encoding unit 10, and validity/invalidity of each XOR circuit is set on the basis of the parameters. That makes it possible to configure the encoding unit 10 according to the parameters.

FIG. 4A is a flowchart for explaining exemplary operations performed in the encoding apparatus 2 according to the first embodiment. When the encoding apparatus 2 is switched ON, the parameters are received from, for example, outside (Step S110). Then, those parameters are held in the parameter holding unit 12 (Step S111). At that time, it is also possible to send the parameters that are held in the parameter holding unit 12 to the encoding unit 10. Besides, the parameters are sent also to the error-detecting code generating unit 20. Subsequently, the error-detecting code generating unit 20 generates an error-detecting code with the use of those parameters, and sends the error-detecting code to the error-detecting code holding unit 21 for holding (Step S112).

Then, the encoding apparatus 2 waits for the arrival of input data that is the target data for encoding (Step S113). Upon receiving the target data for encoding, the encoding apparatus 2 sends that target data for encoding to the encoding unit 10 as well as to the first selection input terminal of the output selecting unit 11 (Step S114).

Subsequently, the error detecting unit 22 makes use of the error-detecting code held in the error-detecting code holding unit 21 and performs error detection with respect to the parameters held in the parameter holding unit 12 (Step S115). According to the result of error detection, the error detecting unit 22 determines whether or not there is any error in the parameters (Step S116).

If it is determined that there is no error in the parameters (No at Step S116), then the error detecting unit 22 outputs an error detection signal indicating the absence of any error in the parameters to the parameter selecting unit 24, and the system control proceeds to Step S117. In accordance with the error detection signal sent by the error detecting unit 22, the parameter selecting unit 24 selects the first selection input terminal to which the parameter holding unit 12 is connected. Then, the parameters held in the parameter holding unit 12 are sent to the encoding unit 10 via the parameter selecting unit 24 (Step S117).

Meanwhile, if it is determined that there is an error in the parameters (Yes at Step S116), then the error detecting unit 22 outputs an error detection signal indicating the presence of an error in the parameters to the parameter selecting unit 24, and the system control proceeds to Step S118. In accordance with the error detection signal sent by the error detecting unit 22, the parameter selecting unit 24 selects the second selection input terminal to which the output of the error correcting unit 23 is connected. Then, the error correcting unit 23 makes use of the error-detecting code held in the error-detecting code holding unit 21 and corrects the error present in the parameters that are held in the parameter holding unit 12. The parameters that are subjected to error correction are then sent to the encoding unit 10 via the parameter selecting unit 24 (Step S118).

Once the operation at Step S117 or Step S118 is completed, the system control proceeds to Step S119. Then, the encoding unit 10 makes use of the parameters sent by the parameter selecting unit 24 and encodes the target data for encoding that has been received at Step S114 (Step S119). At this stage, in the output selecting unit 11, the first selection input terminal is selected; and the target data for encoding is output without modification as output data (Step S120).

Then, the encoding apparatus 2 determines whether or not any target data for encoding still remains unprocessed, that is, determines whether or not the encoding unit 10 has encoded a predetermined volume of target data for encoding (Step S121). If it is determined that a predetermined volume of target data for encoding is not yet encoded and there still remains some target data for encoding (Yes at Step S121), then the system control returns to Step S114 and the operations are repeated with respect to the remaining target data for encoding.

On the other hand, if it is determined that a predetermined volume of target data for encoding has been encoded and no target data for encoding remains unprocessed (No at Step S121), then the system control proceeds to Step S122. Subsequently, the encoding unit 10 outputs an encoding operation completion signal, which indicates that a predetermined volume of target data for encoding has been encoded, to the output selecting unit 11. In accordance with that encoding operation completion signal, the output selecting unit 11 switches the input terminal from the first selection input terminal to the second selection input terminal to which the output of the encoding unit 10 is connected; and outputs the encoded data, which is obtained as a result of encoding performed by the encoding unit 10 with respect to the target data for encoding, as output data (Step S122). Then, the system control returns to Step S113.

In this way, during the encoding operation performed in the encoding apparatus 2, the encoded data that is obtained as a result of encoding of the target data for encoding can be output along with the target data for encoding. At that time, the encoding unit 10 performs error detection with respect to the parameters that are used in the encoding operation. If an error is found, error correction is performed with respect to corresponding parameters, and the parameters subjected to error correction are then sent to the encoding unit 10. Hence, even if a soft error causes an error in the parameters that are held in the parameter holding unit 12, it is possible to perform encoding in a correct manner.

First Modification Example of First Embodiment

Given below is the explanation of the first modification example of the first embodiment. In the flowchart illustrated in FIG. 4A, the operations from Step S114 to Step S121 are performed in a sequential manner. However, that is only one example. As another example, the explanation is given for a case when the generating polynomial G(x) mentioned above is used in the encoding unit 10. In this case, inputting the target data for encoding performed at Step S114 and the encoding performed at Step S119 are carried out in a concurrent manner. That is, the target data for encoding that is input bit-by-bit at each clock (Step S114) is held in a sequentially-shifting manner in the registers that are equal in number to the maximal degree of the generating polynomial G(x). Then, at each clock, the data held in each register is retrieved as encoded output data (Step S119). Meanwhile, the error detecting operation at Steps S115 and S116 and the error correcting operation at Step S118 can also be performed in a concurrent manner with the operation of inputting the target data for encoding and the encoding operation.

Thus, in a configuration in which the operations are performed in a concurrent manner, if an error is detected in a parameter at Step S116, then there are times when the encoding unit 10 performs encoding with unintended operations due to the parameter having the error. In that regard, in the first modification example of the first embodiment, if an error is detected in a parameter at Step S116, the encoding operation performed by the encoding unit 10 is temporarily discontinued.

Figure 4B:
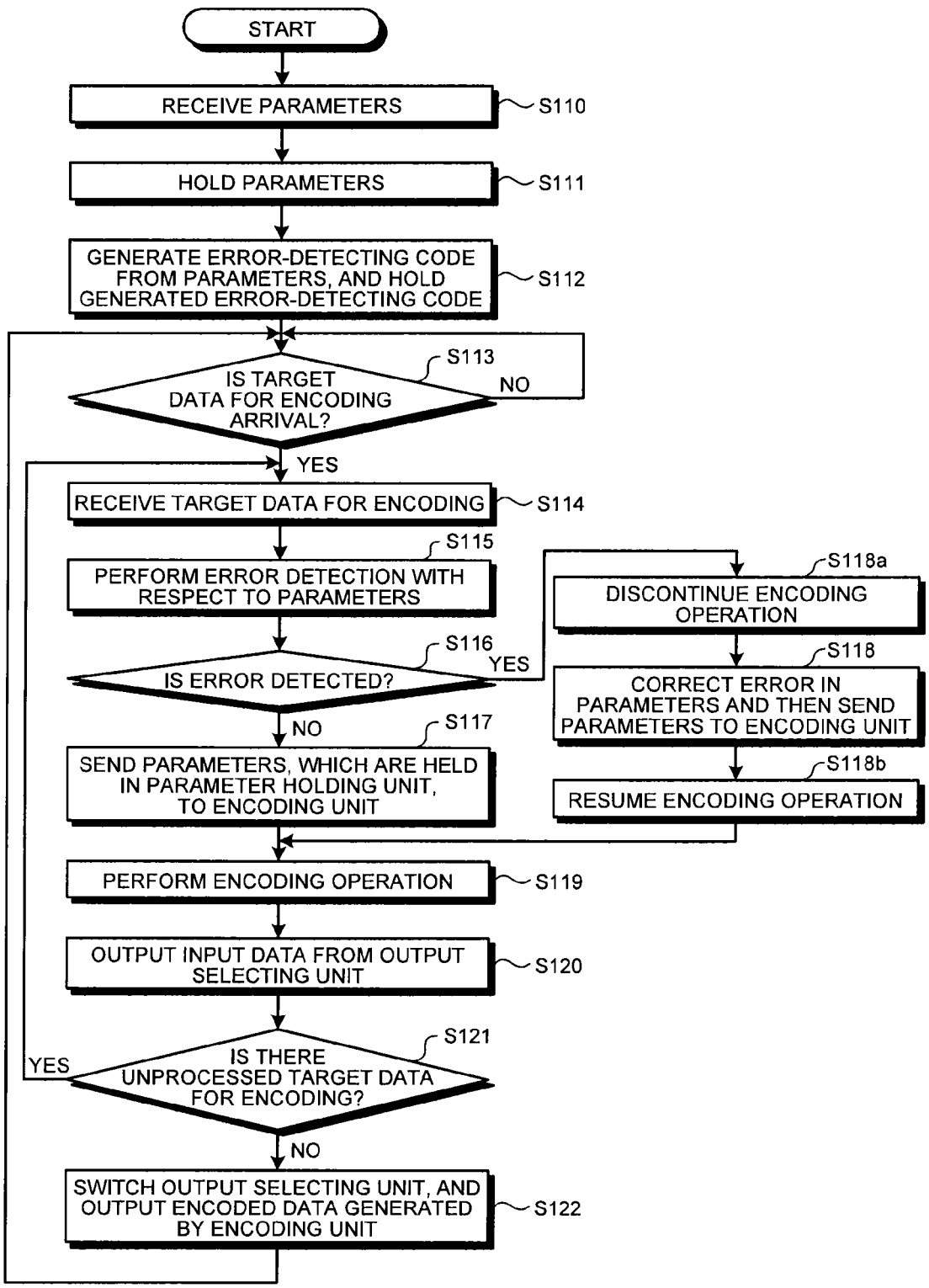
FIG. 4B is a flowchart for explaining exemplary operations performed in the encoding apparatus according to a first modification example of the first embodiment.

FIG. 4B is a flowchart for explaining exemplary operations performed in the encoding apparatus 2 according to the first modification example of the first embodiment. In the flowchart explained with reference to FIG. 4B, the operations identical to those illustrated in FIG. 4A are referred to by the same step numbers and the detailed explanation thereof is not repeated. As compared to the flowchart illustrated in FIG. 4A, in the flowchart illustrated in FIG. 4B, Step S118a for discontinuing the encoding operation is added prior to Step S118; while Step S118b for resuming the encoding operation that has been discontinued is added subsequent to Step S118.

More particularly, if it is determined that there is an error in the parameters (Yes at Step S116), then the error detecting unit 22 outputs an error detection signal indicating the presence of an error in the parameters to the parameter selecting unit 24, and the system control proceeds to Step S118a. Then, for example, the error detecting unit 22 instructs the encoding unit 10 to temporarily discontinue the encoding operation (Step S118a). More particularly, the error detecting unit 22 outputs, for example, a control signal such as an enable signal (not illustrated) to the encoding unit 10 and temporarily discontinues the encoding operation being performed by the encoding unit 10. Alternatively, the encoding operation being performed by the encoding unit 10 can be discontinued by implementing other methods such as stopping the clock of the encoding unit 10.

When the encoding operation is discontinued at Step S118a, the system control proceeds to Step S118. Then, in an identical manner to that described above, the error correcting unit 23 makes use of the error-detecting code held in the error-detecting code holding unit 21 and corrects the error present in the parameters that are held in the parameter holding unit 12. The parameters that are subjected to error correction are then sent to the encoding unit 10 via the parameter selecting unit 24 (Step S118).

Once the parameters that are subjected to error correction are sent to the encoding unit 10 at Step S118, the system control proceeds to Step S118b. Then, for example, the error detecting unit 22 instructs the encoding unit 10 to resume the encoding operation (Step S118b). For example, the error detecting unit 22 outputs a control signal for resumption of the encoding operation to the encoding unit 10. When an instruction for resuming the encoding operation is issued to the encoding unit 10, the system control proceeds to Step S119 and the encoding operation is resumed in the encoding unit 10.

Second Modification Example of First Embodiment

Given below is the explanation of the second modification example of the first embodiment. For example, consider a case when a predetermined volume of encoded data needs to be output continuously. In such a case, in the first modification example of the first embodiment, the temporary discontinuation and resumption of the encoding operation leads to discontinuity in the encoded data. This may result in malfunctioning. In that regard, in the second modification example, when it is determined that there is an error in the parameters (Yes at Step S116), the encoding unit 10 restarts the encoding operation from the beginning.

Figure 4C:
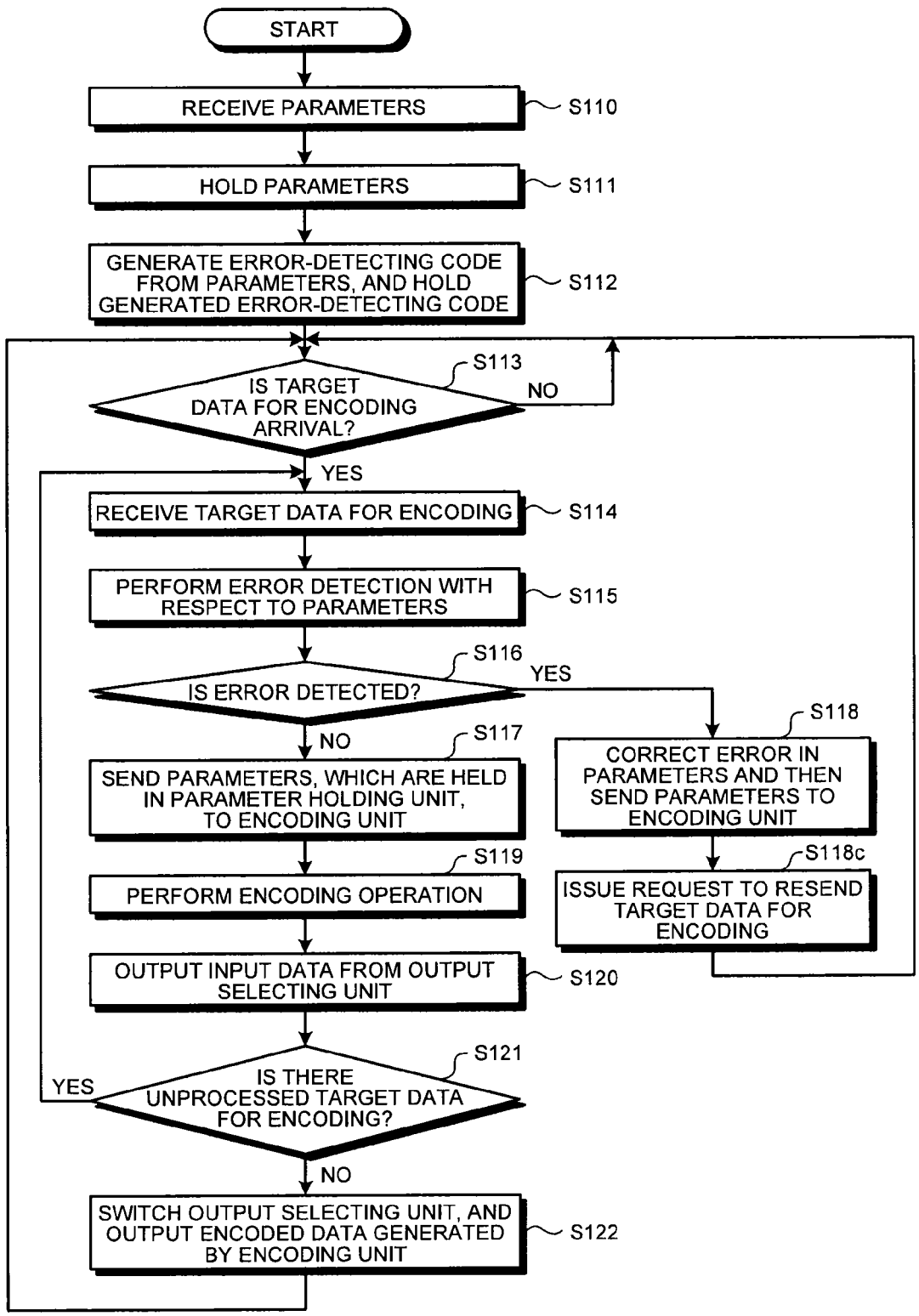
FIG. 4C is a flowchart for explaining exemplary operations performed in the encoding apparatus according to a second modification example of the first embodiment.

FIG. 4C is a flowchart for explaining exemplary operations performed in the encoding apparatus 2 according to the second modification example of the first embodiment. In the flowchart explained with reference to FIG. 4C, the operations identical to those illustrated in FIG. 4A are referred to by the same step numbers and the detailed explanation thereof is not repeated. As compared to the flowchart illustrated in FIG. 4A, in the flowchart illustrated in FIG. 4C, Step S118c for issuing a request to resend the target data for encoding is added subsequent to Step S118, and then the system control returns to Step S113.

More particularly, if it is determined that there is an error in the parameters (Yes at Step S116), then the error detecting unit 22 outputs an error detection signal indicating the presence of an error in the parameters to the parameter selecting unit 24, and the system control proceeds to Step S118. Then, in an identical manner to that described above, the error correcting unit 23 makes use of the error-detecting code held in the error-detecting code holding unit 21 and corrects the error present in the parameters that are held in the parameter holding unit 12. The parameters that are subjected to error correction are then sent to the encoding unit 10 via the parameter selecting unit 24 (Step S118).

Once the parameters that are subjected to error correction are sent to the encoding unit 10 at Step S118, the system control proceeds to Step S118c. Then, for example, the error correcting unit 23 requests the source of sending the target data for encoding (i.e., requests a host apparatus) to resend the target data for encoding (Step S118c). For example, consider a case when the encoding operation is performed in the units of data blocks of a predetermined size. In that case, while a particular data block of the target data for encoding is being encoded; if an error in the parameters is detected at Step S116, the error correcting unit 23 requests the host apparatus to resend that data block of the target data for encoding.

Once a request for resending the target data for encoding is issued at Step S118c, the system control returns to Step S113 to wait for the arrival of the requested target data for encoding.

In this way, in the second modification example of the first embodiment, when an error is detected in the parameters used by the encoding unit 10, the error in the parameters is corrected and a request is issued for resending the target data for encoding that was being encoded at the point of time of error detection. For that reason, when the encoded data is required in the units of data blocks of a predetermined size of the target data for encoding, it becomes possible to prevent any malfunctioning from occurring.

As an example, consider the case when the encoded data, which is obtained as a result of encoding performed by the encoding unit 10 and which is output from the output selecting unit 11, is written in a NAND flash memory. As a known fact, in a NAND flash memory, it is necessary to write data in the units of data blocks of a predetermined size. Hence, it is necessary that at least the encoded data equivalent to a data block of the target data for encoding is output from the output selecting unit 11 in a continuous manner without any break.

According to the second modification example of the first embodiment, if an error is detected in the parameters, the encoding operation being performed with respect to a data block of the target data for encoding at that point of time is restarted from the beginning. As a result, it becomes possible to continuously output the encoded data in the units of data blocks. Hence, the encoding apparatus 2 according to the second modification example of the first embodiment is suitable for use as part of a controller for a NAND flash memory.

Second Embodiment

Given below is the explanation of the second embodiment. FIG. 5 illustrates an exemplary configuration of an encoding apparatus 3 according to the second embodiment. With reference to FIG. 5, the constituent elements identical to those illustrated in FIG. 3 are referred to by the same reference numerals, and the detailed explanation thereof is not repeated. As far as the constituent elements are concerned, the encoding apparatus 3 is identical to the encoding apparatus 2 explained with reference to FIG. 3.

In the encoding apparatus 3 according to the second embodiment, the parameters that are subjected to error correction by the error correcting unit 23 are sent to the parameter holding unit 12 and held therein by overwriting the already-held parameters. In an identical manner, in the encoding apparatus 3, the error-detecting code that is subjected to error correction by the error correcting unit 23 is sent to the error-detecting code holding unit 21 and held therein by overwriting the already-held error-detecting code.

Figure 6:
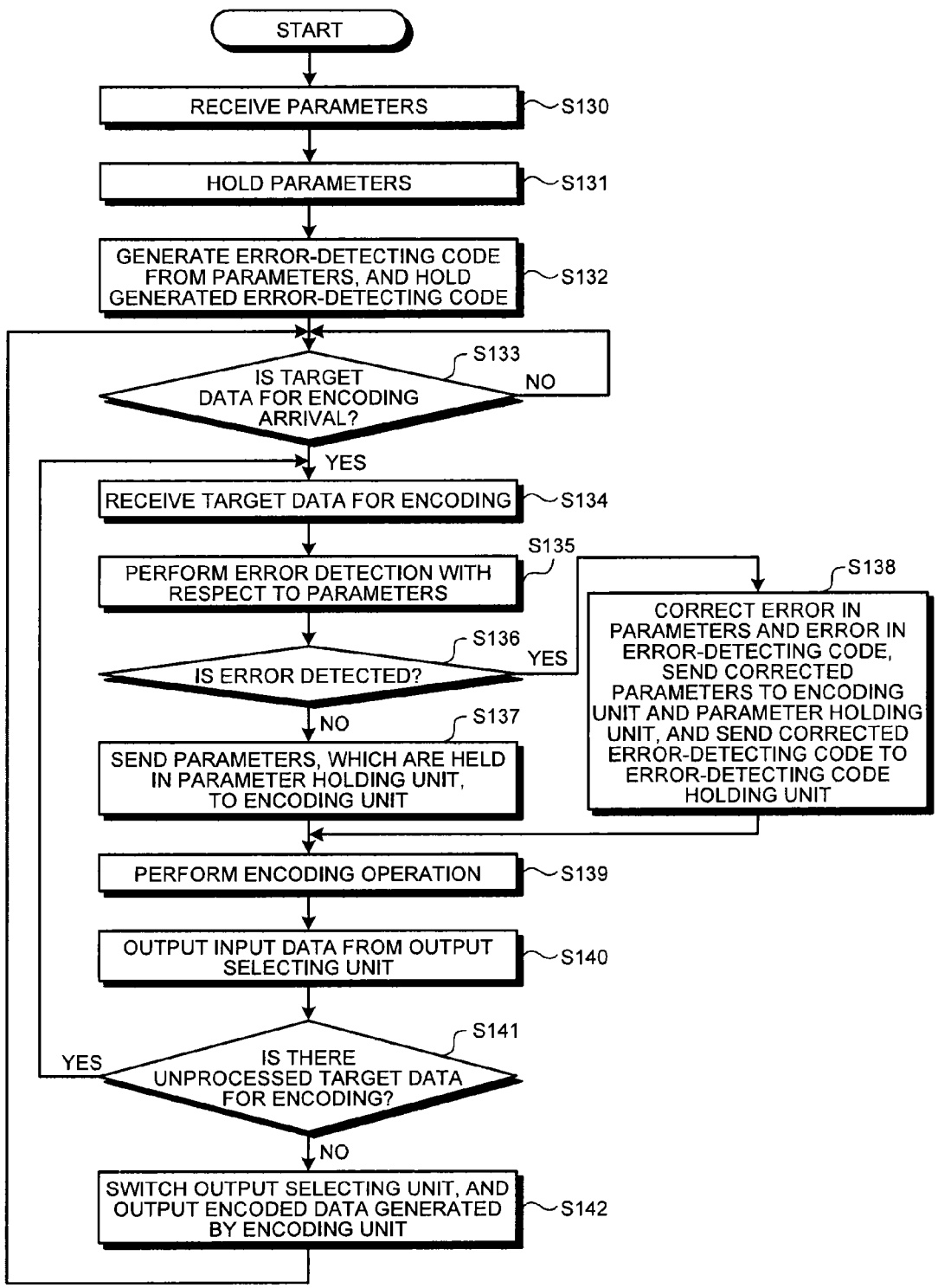
FIG. 6 is a flowchart for explaining exemplary operations performed in the encoding apparatus according to the second embodiment.

FIG. 6 is a flowchart for explaining exemplary operations performed in the encoding apparatus 3 according to the second embodiment. When the encoding apparatus 3 is switched ON, the parameters are received from, for example, outside (Step S130). Then, those parameters are held in the parameter holding unit 12 as well as sent to the error-detecting code generating unit 20 (Step S131). Then, the error-detecting code generating unit 20 generates an error-detecting code with the use of the received parameters, and stores the error-detecting code in the error-detecting code holding unit 21 (Step S132).

Subsequently, the encoding apparatus 3 waits for the arrival of input data that is the target data for encoding (Step S133). Upon receiving the target data for encoding, the encoding apparatus 3 sends that target data for encoding to the encoding unit 10 as well as to the first selection input terminal of the output selecting unit 11 (Step S134).

Then, the error detecting unit 22 makes use of the error-detecting code held in the error-detecting code holding unit 21 and performs error detection with respect to the parameters held in the parameter holding unit 12 (Step S135). Based on the result of error detection, the error detecting unit 22 determines whether or not an error is detected (Step S136).

If it is determined that no error is detected (No at Step S136), then the error detecting unit 22 outputs an error detection signal indicating the absence of any error the parameter selecting unit 24, and the system control proceeds to Step S137. In accordance with the error detection signal sent by the error detecting unit 22, the parameter selecting unit 24 selects the first selection input terminal to which the parameter holding unit 12 is connected. Then, the parameters held in the parameter holding unit 12 are sent to the encoding unit 10 via the parameter selecting unit 24 (Step S137).

Meanwhile, if it is determined that an error is detected (Yes at Step S136), then the error detecting unit 22 outputs an error detection signal indicating the presence of an error to the parameter selecting unit 24, and the system control proceeds to Step S138. In accordance with the error detection signal sent by the error detecting unit 22, the parameter selecting unit 24 selects the second selection input terminal to which the output of the error correcting unit 23 is connected.

Then, the error correcting unit 23 makes use of the error-detecting code held in the error-detecting code holding unit 21, and performs error correction with respect to the parameters that are held in the parameter holding unit 12 and with respect to the error-detecting code held in the error-detecting code holding unit 21. The parameters that are subjected to error correction are then sent to the encoding unit 10 via the parameter selecting unit 24 as well as sent to the parameter holding unit 12 and held therein by overwriting the already-held parameters. Similarly, the error-detecting code that is subjected to error correction is sent to the error-detecting code holding unit 21 and held therein by overwriting the already-held error-detecting code (Step S138).

Once the operation at Step S137 or Step S138 is completed, the system control proceeds to Step S139. Then, the encoding unit 10 makes use of the parameters sent by the parameter selecting unit 24 and encodes the target data for encoding that has been received at Step S134 (Step S139). At this stage, in the output selecting unit 11, the first selection input terminal is selected; and the target data for encoding is output without modification as output data (Step S140).

Then, the encoding apparatus 3 determines whether or not any target data for encoding still remains unprocessed, that is, determines whether or not a predetermined volume of target data for encoding has been encoded (Step S141). If it is determined that a predetermined volume of target data for encoding is not yet encoded and there still remains some target data for encoding (Yes at Step S141), then the system control returns to Step S134 and the operations are repeated with respect to the remaining target data for encoding.

On the other hand, if it is determined that a predetermined volume of target data for encoding has been encoded and no target data for encoding remains unprocessed (No at Step S141), then the system control proceeds to Step S142. Subsequently, the encoding unit 10 outputs an encoding operation completion signal, which indicates that a predetermined volume of target data for encoding has been encoded, to the output selecting unit 11. In accordance with the encoding operation completion signal, the output selecting unit 11 switches the input terminal from the first selection input terminal to the second selection input terminal and outputs the encoded data, which is obtained as a result of encoding performed by the encoding unit 10 with respect to the target data for encoding, as output data (Step S142). Then, the system control returns to Step S133.

In this way, in the encoding apparatus 3, error detection is performed with respect to the parameters that are used in the encoding operation performed by the encoding unit 10. If an error is detected in the parameters, then the error is corrected before sending the parameters to the encoding unit 10. In addition, in the encoding apparatus 3, every time an error is detected in the parameters held in the parameter holding unit 12, error correction performed with respect to the parameters is followed by overwriting the parameters that are already held in the parameter holding unit 12 with the parameters subjected to error correction. Because of that, even if a soft error occurs in the parameters held in the parameter holding unit 12, it becomes possible to perform encoding in a correct manner and with a high degree of reliability.

Meanwhile, in the second embodiment too, if an error is detected in the parameters (Yes at Step S136); then, as explained in the first modification example of the first embodiment, the error correction performed with respect to the parameters at Step S138 can be preceded by discontinuation of the encoding operation and followed by resumption of the encoding operation. Similarly, if an error is detected in the parameters (Yes at Step S136); then, as explained in the second modification example of the first embodiment, the error correction performed with respect to the parameters at Step S138 can be followed by requesting the source of sending the target data for encoding to resend the target data for encoding. Then, the system control can return to Step S133 to wait for the arrival of the requested target data for encoding.

Third Embodiment

Figure 7:
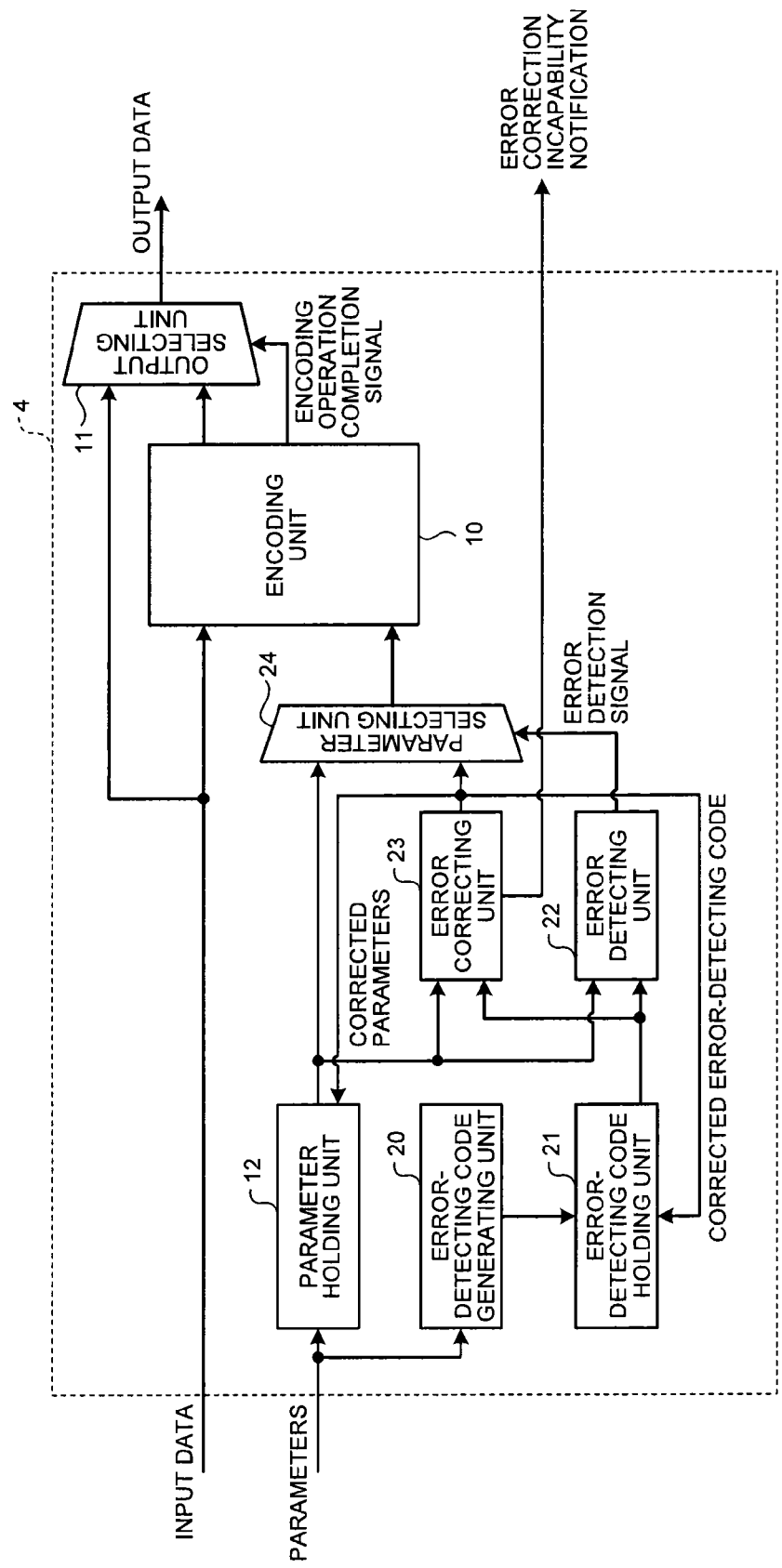
FIG. 7 is a block diagram illustrating an exemplary configuration of an encoding apparatus according to a third embodiment.

Given below is the explanation of the third embodiment. FIG. 7 illustrates an exemplary configuration of an encoding apparatus 4 according to the third embodiment. With reference to FIG. 7, the constituent elements identical to those illustrated in FIG. 5 are referred to by the same reference numerals, and the detailed explanation thereof is not repeated. As far as the constituent elements are concerned, the encoding apparatus 4 is nearly identical to the encoding apparatus 3 explained with reference to FIG. 5.

As compared to the encoding apparatus 3, the encoding apparatus 4 is configured to have an additional function by which the error correcting unit 23 outputs an error correction incapability notification. That is, in the encoding apparatus 4, during the error correcting operation performed by the error correcting unit 23 with respect to the parameters and the error-detecting code; when an error that is beyond the error correcting capability of the error-detecting code (the error-detecting/error-correcting code) is found in the parameters or in the error-detecting code, an error correction incapability notification is output to the outside indicating that the error in the parameters or the error-detecting code cannot be corrected.

Figure 8:
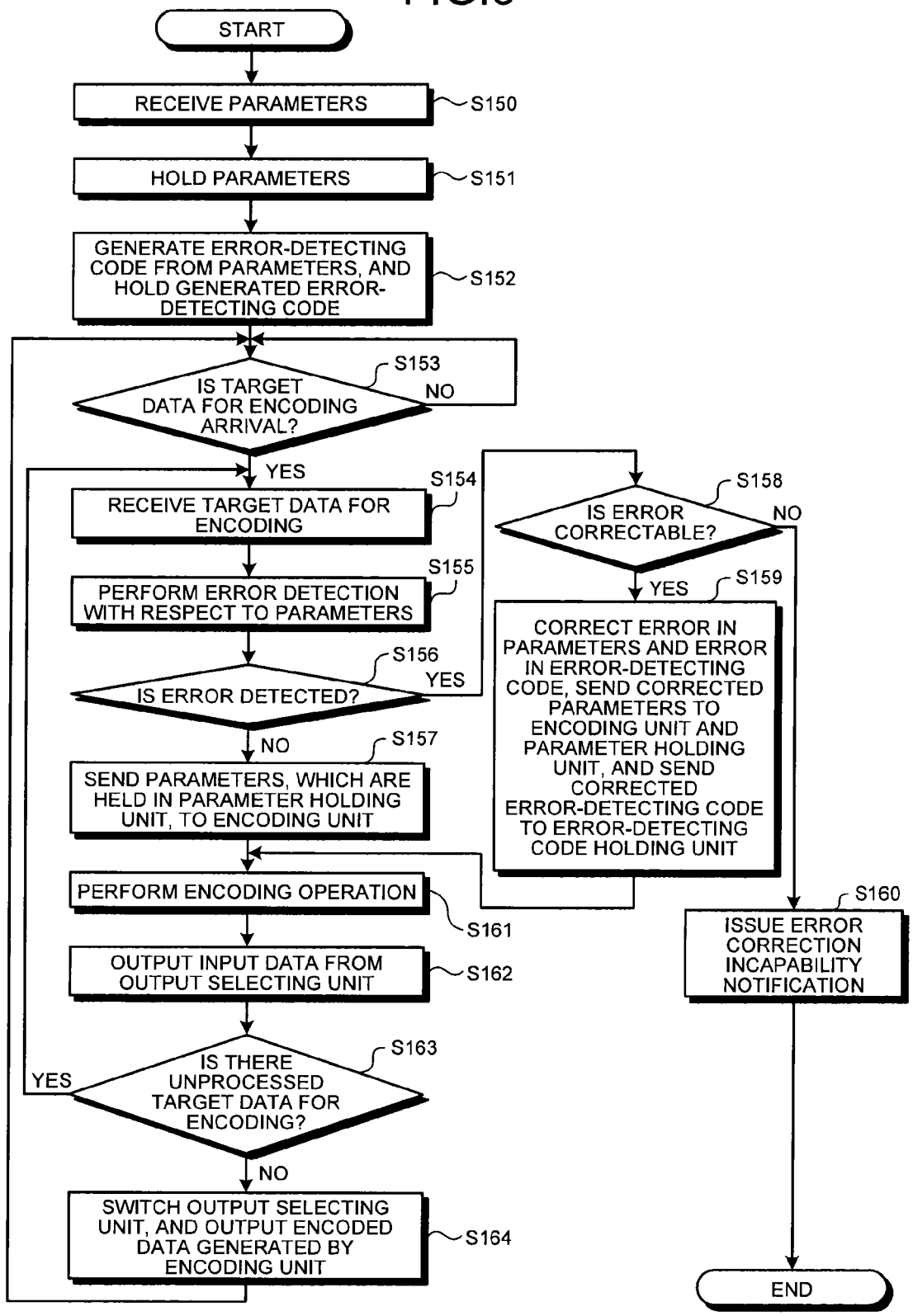
FIG. 8 is a flowchart for explaining exemplary operations performed in the encoding apparatus according to the third embodiment.

FIG. 8 is a flowchart for explaining exemplary operations performed in the encoding apparatus 4 according to the third embodiment. In the flowchart illustrated in FIG. 8, except for the operations performed at Step S158 and Step S160, the other operations are identical to the operations in the flowchart illustrated in FIG. 6. Thus, when the encoding apparatus 4 is switched ON, the parameters are received from outside (Step S150) and are held in the parameter holding unit 12 as well as sent to the error-detecting code generating unit 20 (Step S151). Then, the error-detecting code generating unit 20 generates an error-detecting code with the use of the received parameters and stores that error-detecting code in the error-detecting code holding unit 21 (Step S152).

Subsequently, the encoding apparatus 4 waits for the input of input data that is the target data for encoding (Step S153). Upon receiving the target data for encoding, the encoding apparatus 4 sends the target data for encoding to the encoding unit 10 as well as to the first selection input terminal of the output selecting unit 11 (Step S154).

Then, the error detecting unit 22 makes use of the error-detecting code held in the error-detecting code holding unit 21 and performs error detection with respect to the parameters held in the parameter holding unit 12 (Step S155). Based on the result of error detection, the error detecting unit 22 determines whether or not an error is detected (Step S156).

If it is determined that no error is detected (No at Step S156), then the error detecting unit 22 outputs an error detection signal indicating the absence of any error to the parameter selecting unit 24, and the system control proceeds to Step S157. In accordance with the error detection signal sent by the error detecting unit 22, the parameter selecting unit 24 selects the first selection input terminal to which the parameter holding unit 12 is connected. Then, the parameters held in the parameter holding unit 12 are sent to the encoding unit 10 via the parameter selecting unit 24 (Step S157).

Meanwhile, if it is determined that an error is detected (Yes at Step S156), then the error detecting unit 22 outputs an error detection signal indicating the presence of an error to the parameter selecting unit 24, and the system control proceeds to Step S158. In accordance with the error detection signal sent by the error detecting unit 22, the parameter selecting unit 24 selects the second selection input terminal to which the output of the error correcting unit 23 is connected.

Then, based on the error detection result obtained by the error detecting unit 22 at Step S155, the error correcting unit 23 determines whether or not the detected error can be corrected with the error correcting capability of the error-detecting code (the error-detecting/error-correcting code) (Step S158).

If it is determined that the detected error can be corrected with the error correcting capability of the error-detecting code (Yes at Step S158), then the system control proceeds to Step S159. Subsequently, the error correcting unit 23 makes use of the error-detecting code held in the error-detecting code holding unit 21 and performs error correction with respect to the parameters held in the parameter holding unit 12 and with respect to the error-detecting code. The parameters that are subjected to error correction are then sent to the encoding unit 10 via the parameter selecting unit 24 as well as sent to the parameter holding unit 12 and held therein by overwriting the already-held parameters. Similarly, the error-detecting code that is subjected to error correction is sent to the error-detecting code holding unit 21 and held therein by overwriting the already-held error-detecting code (Step S159).

Once the operation at Step S157 or Step S159 is completed, the system control proceeds to Step S161. Then, the encoding unit 10 makes use of the parameters sent by the parameter selecting unit 24 and encodes the target data for encoding that has been received at Step S154 (Step S161). At this stage, in the output selecting unit 11, since the first selection input terminal is selected; the target data for encoding is output without modification as output data (Step S162).

Then, the encoding apparatus 4 determines whether or not any target data for encoding still remains unprocessed (Step S163). If it is determined that there still remains some target data for encoding (Yes at Step S163), then the system control returns to Step S154 and the operations are repeated with respect to the remaining target data for encoding.

On the other hand, if it is determined that no target data for encoding remains unprocessed (No at Step S163), then the system control proceeds to Step S164. Subsequently, the encoding unit 10 outputs an encoding operation completion signal, which indicates that a predetermined volume of target data for encoding has been encoded, to the output selecting unit 11. In accordance with the encoding operation completion signal, the output selecting unit 11 switches the input terminal from the first selection input terminal to the second selection input terminal and outputs the encoded data, which is obtained as a result of encoding performed by the encoding unit 10 with respect to the target data for encoding, as output data (Step S164). Then, the system control returns to Step S153.

Meanwhile, if it is determined that the detected error cannot be corrected with the error correcting capability of the error-detecting code (No at Step S158), then the system control proceeds to Step S160. Subsequently, the error correcting unit 23 outputs an error correction incapability notification to the outside indicating that the detected error cannot be corrected (Step S160). That marks the end of the operations explained with reference to FIG. 8. For example, as soon as an error correction incapability notification is output at Step S160, the encoding operation performed by the encoding unit 10 is terminated and it is ensured that the encoded data does not get output from the encoding apparatus 4.

In this way, in the encoding apparatus 4, error detection and error correction is performed with respect to the parameters that are used in the encoding operation performed by the encoding unit 10, and then the parameters are sent to the encoding unit 10. Every time an error is detected in the parameters, that error is corrected before overwriting the parameters already held in the parameter holding unit 12 with the parameters subjected to error correction. That makes it possible to deal with soft errors as well as to achieve a high degree of reliability.

Moreover, if error detection performed with respect to the parameters held in the parameter holding unit 12 yields a result indicating that an error is detected which is beyond the error correcting capability of the error-detecting code, then the fact is notified to the outside so that incorrect encoding can be prevented from being carried out.

Meanwhile, in the third embodiment too, if an error is detected in the parameters (Yes at Step S156); then, as explained in the first modification example of the first embodiment, the error correction performed with respect to parameters at Step S159 can be preceded by discontinuation of the encoding operation and followed by resumption of the encoding operation. Similarly, if an error is detected in the parameters (Yes at Step S156); then, as explained in the second modification example of the first embodiment, the error correction performed with respect to parameters at Step S159 can be followed by requesting the source of sending the target data for encoding to resend the target data for encoding. Then, the system control can return to Step S153 to wait for the arrival of the requested target data for encoding.

Fourth Embodiment

Figure 9:
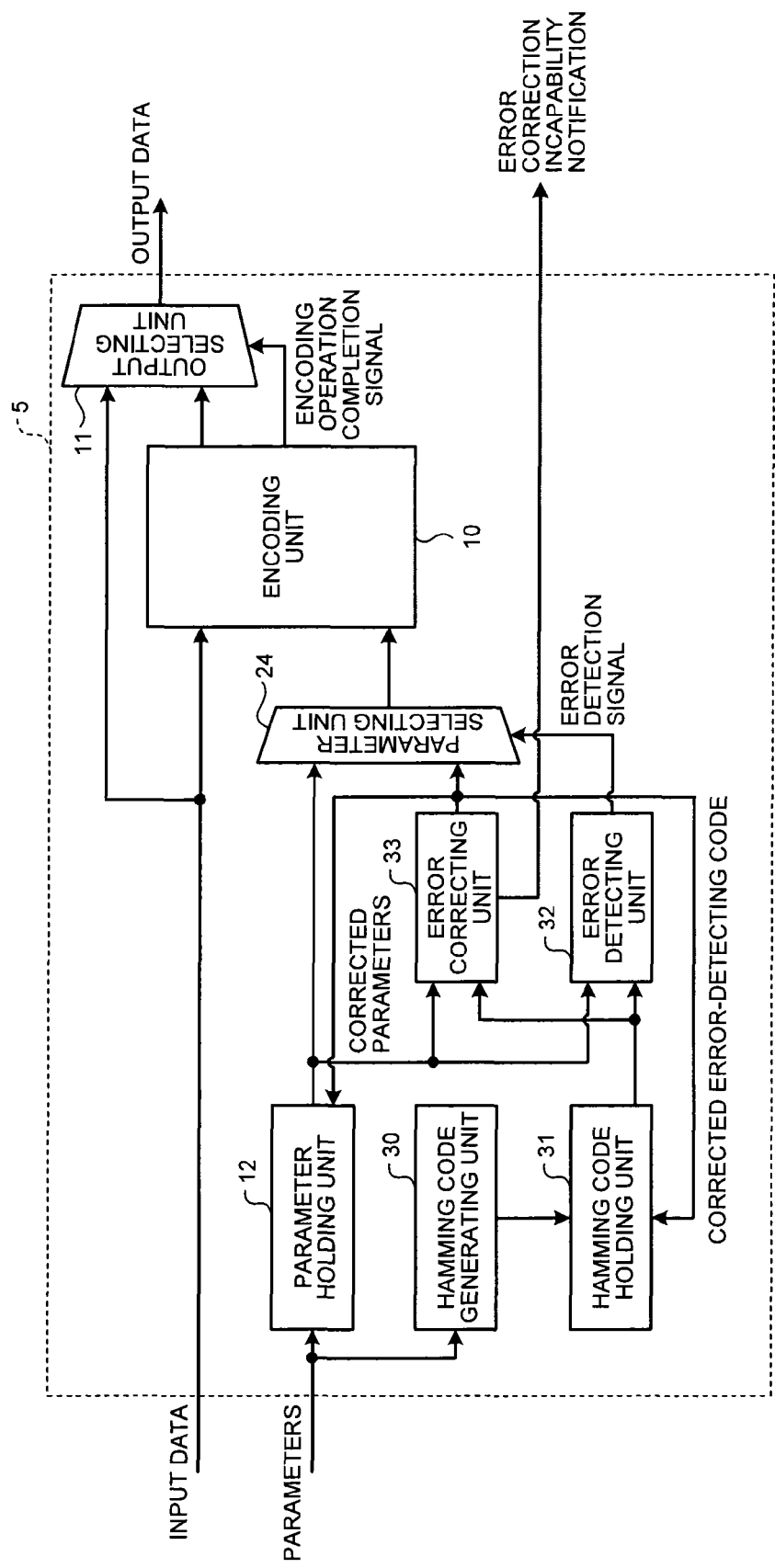
FIG. 9 is a block diagram illustrating an exemplary configuration of an encoding apparatus according to a fourth embodiment.

Given below is the explanation of the fourth embodiment. FIG. 9 illustrates an exemplary configuration of an encoding apparatus 5 according to the fourth embodiment. With reference to FIG. 9, the constituent elements identical to those illustrated in FIG. 7 are referred to by the same reference numerals, and the detailed explanation thereof is not repeated. The encoding apparatus 5 is an example of using the hamming code as the error-detecting code in the encoding apparatus 4. Thus, in the encoding apparatus 5, the error-detecting code generating unit 20 and the error-detecting code holding unit 21 of the encoding apparatus 4 illustrated in FIG. 7 are respectively replaced with a hamming code generating unit 30 and a hamming code holding unit 31. Moreover, the error detecting unit 22 is replaced with an error detecting unit 32 that performs error detection using the hamming code; and the error correcting unit 23 is replaced with an error correcting unit 33 that performs error correction using the hamming code.

With reference to FIG. 9, the parameters used in the encoding operation performed by the encoding unit 10 are held in the parameter holding unit 12 as well as sent to the hamming code generating unit 30. Then, with the use of those parameters, the hamming code generating unit 30 generates a code that is based on the hamming code. The generated code is held in the hamming code holding unit 31 that is configured with, for example, registers. The generated code and the parameters constitute the hamming code.

The error detecting unit 32 performs error detection with the use of the parameters held in the parameter holding unit 12 and with the use of the code held in the hamming code holding unit 31. Then, the error detecting unit 32 performs syndrome calculation with the use of the code held in the hamming code holding unit 31 and with the use of the parameters held in the parameter holding unit 12. If all values of the calculated syndrome are "0", then the error detecting unit 32 determines that neither the parameters nor the code has any error. On the other hand, if even one of the values of the calculated syndrome is not "0", the error detecting unit 32 determines that at least either the parameters have an error or the code has an error. Then, the error detecting unit 32 outputs the error detection result in the form of an error detection signal to the parameter selecting unit 24.

The error correcting unit 33 performs error correction with the use of the parameters held in the parameter holding unit 12 and with the use of the code held in the hamming code holding unit 31. Then, the error correcting unit 33 performs syndrome calculation with the use of the code held in the hamming code holding unit 31 and with the use of the parameters held in the parameter holding unit 12. Alternatively, the error correcting unit 33 can receive the result of syndrome calculation from the error detecting unit 32. Based on the values of the calculated syndrome, if a 1-bit error is found, then the error correcting unit 33 identifies the error position and performs error correction by inverting the bit value at the error position.

However, if an error has two bits or more, then it is beyond the error correcting capability of the hamming code. Hence, error correction cannot be performed. In such a case, the error correcting unit 33 outputs an error correction incapability notification indicating that the error cannot be corrected.

Figure 10:
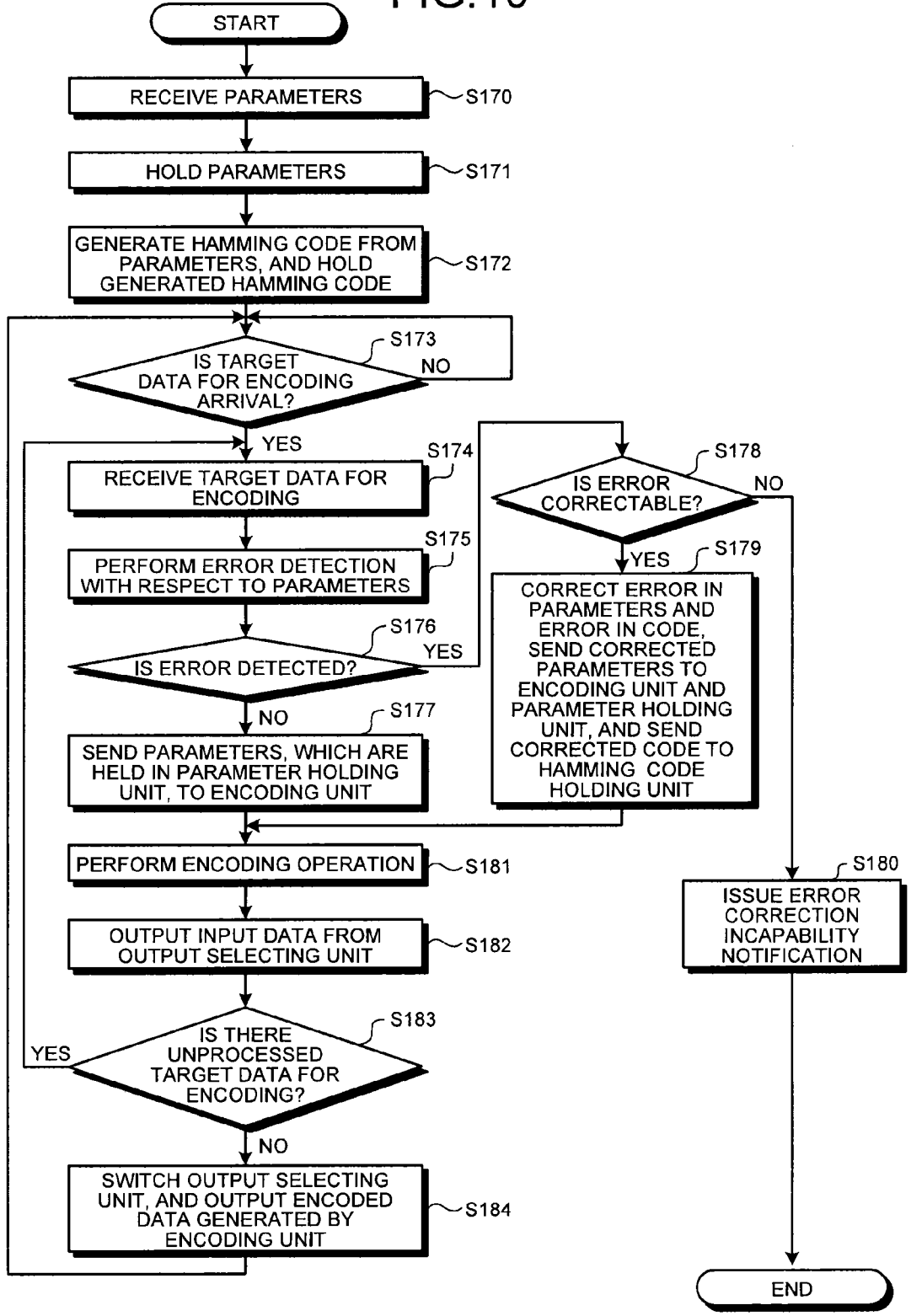
FIG. 10 is a flowchart for explaining exemplary operations performed in the encoding apparatus according to the fourth embodiment.

FIG. 10 is a flowchart for explaining exemplary operations performed in the encoding apparatus 5 according to the fourth embodiment. In the flowchart illustrated in FIG. 10, except for the point that error detection is performed using the hamming code, the operations are identical to the operations in the flowchart illustrated in FIG. 8. Thus, when the encoding apparatus 5 is switched ON, the parameters are received from outside (Step S170) and are held in the parameter holding unit 12 as well as sent to the hamming code generating unit 30 (Step S171). Then, with the use of the received parameters, the hamming code generating unit 30 generates a code based on the hamming code and stores the generated code in the hamming code holding unit 31 (Step S172).

Subsequently, the encoding apparatus 5 waits for the input of input data that is the target data for encoding (Step S173). Upon receiving the target data for encoding, the encoding apparatus 5 sends the target data for encoding to the encoding unit 10 as well as to the first selection input terminal of the output selecting unit 11 (Step S174).

Then, the error detecting unit 32 performs error detection with the use of the code held in the hamming code holding unit 31 and with the use of the parameters held in the parameter holding unit 12 (Step S175). Based on the result of error detection, the error detecting unit 32 determines whether or not an error is detected (Step S176).

If it is determined that no error is detected (No at Step S176), then the error detecting unit 32 outputs an error detection signal indicating the absence of any error in the parameters to the parameter selecting unit 24, and the system control proceeds to Step S177. In accordance with the error detection signal sent by the error detecting unit 32, the parameter selecting unit 24 selects the first selection input terminal. Then, the parameters held in the parameter holding unit 12 are sent to the encoding unit 10 via the parameter selecting unit 24 (Step S177).

Meanwhile, if it is determined that an error is detected (Yes at Step S176), then the error detecting unit 32 outputs an error detection signal indicating the presence of an error to the parameter selecting unit 24, and the system control proceeds to Step S178. In accordance with the error detection signal sent by the error detecting unit 32, the parameter selecting unit 24 selects the second selection input terminal.

Then, based on the error detection result obtained by the error detecting unit 32 at Step S175, the error correcting unit 33 determines whether or not the detected error can be corrected with the error correcting capability of the hamming code (Step S178). More particularly, the error correcting unit 33 determines whether or not the detected error is a 1-bit error.

If it is determined that the detected error is a 1-bit error and is correctable (Yes at Step S178), then the system control proceeds to Step S179. Subsequently, the error correcting unit 33 identifies the error bit based on the syndrome values and performs error correction by inverting the value of the identified error bit. The parameters that are subjected to error correction are then sent to the encoding unit 10 via the parameter selecting unit 24 as well as sent to the parameter holding unit 12 and held therein by overwriting the already-held parameters. Similarly, the code that is subjected to error correction is sent to the hamming code holding unit 31 and held therein by overwriting the already-held code (Step S179).

Once the operation at Step S177 or Step S179 is completed, the system control proceeds to Step S181. Then, the encoding unit 10 makes use of the parameters sent by the parameter selecting unit 24 and encodes the target data for encoding that has been received at Step S174 (Step S181). At that time, in the output selecting unit 11, since the first selection input terminal is selected; the target data for encoding is output without modification as output data (Step S182).

Then, the encoding apparatus 5 determines whether or not any target data for encoding still remains unprocessed (Step S183). If it is determined that there still remains some target data for encoding (Yes at Step S183), then the system control returns to Step S174 and the operations are repeated with respect to the remaining target data for encoding.

On the other hand, if it is determined that no target data for encoding remains unprocessed (No at Step S183), then the system control proceeds to Step S184. Subsequently, the encoding unit 10 outputs an encoding operation completion signal, which indicates that a predetermined volume of target data for encoding has been encoded, to the output selecting unit 11. In accordance with the encoding operation completion signal, the output selecting unit 11 switches the input terminal from the first selection input terminal to the second selection input terminal and outputs the encoded data, which is obtained as a result of encoding performed by the encoding unit 10 with respect to the target data for encoding, as output data (Step S184). Then, the system control returns to Step S173.

Meanwhile, if it is determined that the detected error has two bits or more and cannot be corrected with the error correcting capability of the hamming code (No at Step S178), then the system control proceeds to Step S180. Subsequently, the error correcting unit 33 outputs an error correction incapability notification to the outside indicating that the detected error cannot be corrected (Step S180). That marks the end of the operations explained with reference to FIG. 10. For example, as soon as an error correction incapability notification is output at Step S180, the encoding operation performed by the encoding unit 10 is terminated and it is ensured that the encoded data does not get output from the encoding apparatus 5.

In this way, in the encoding apparatus 5, the hamming code is used in performing error detection and error correction with respect to the parameters that are used in the encoding operation performed by the encoding unit 10. The error detecting unit 32 and the error correcting unit 33 operate based on the hamming code and can be configured only with combinational circuits. Hence, when an error is detected and when the error is correctable, error correction can be performed in the same cycle as the cycle in which the error was detected. As a result, the encoding operation performed by the encoding unit 10 need not be temporarily discontinued and can be performed without any break.

Figure 11:
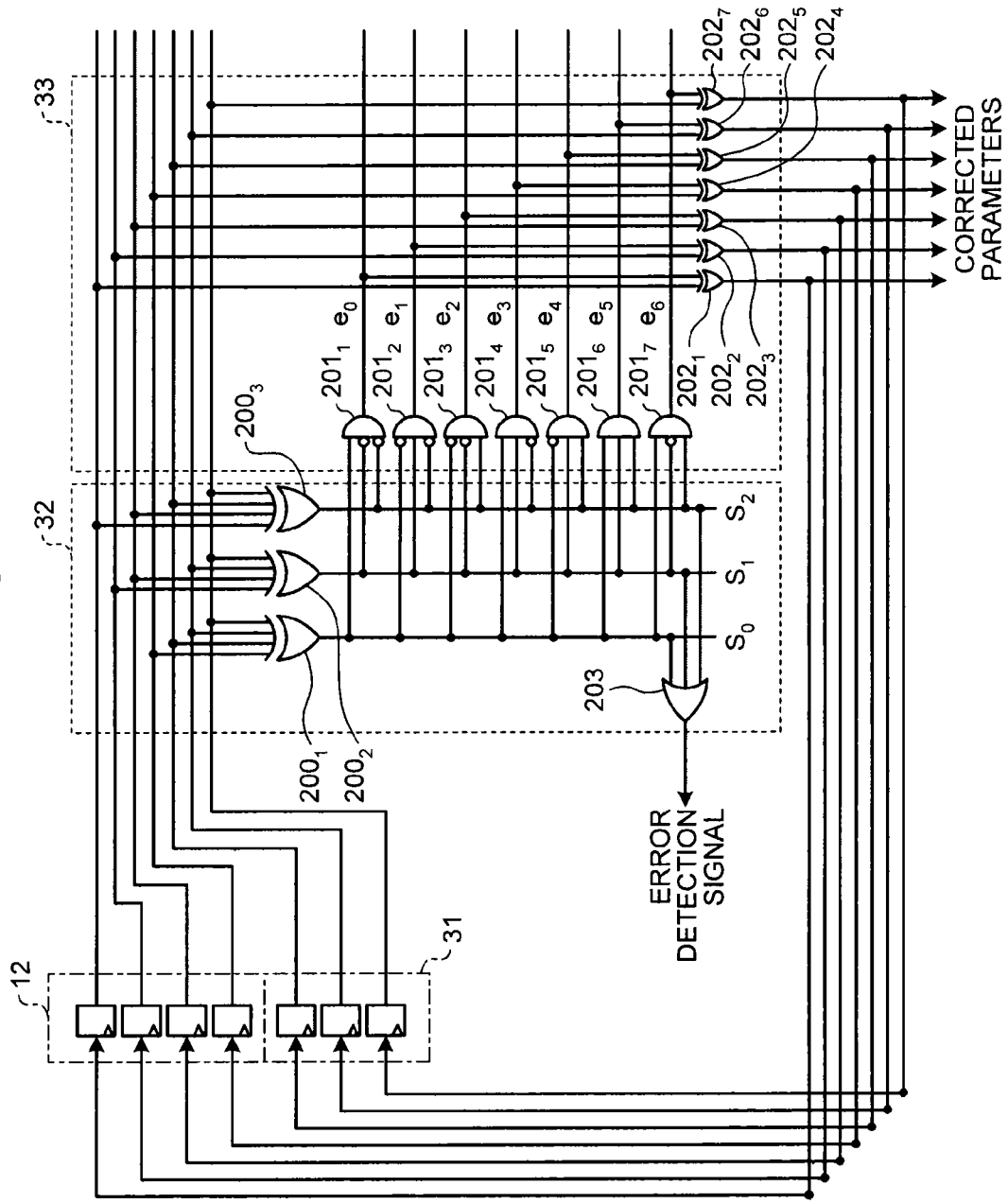
FIG. 11 illustrates an exemplary configuration of an error detecting unit and an error correcting unit using combinational circuits.

FIG. 11 illustrates an exemplary configuration of the error detecting unit 32 and the error correcting unit 33 using combinational circuits. In FIG. 11, the constituent elements identical to those illustrated in FIG. 9 are referred to by the same reference numerals. FIG. 11 illustrates a configuration example corresponding to a hamming (7, 4) code in which data accounts for four bits; a code based on the hamming code, that is, a redundant bit for error correction accounts for three bits; and the total code length is equal to seven bits.

The parameter holding unit 12 includes four registers each capable of holding a single bit. Thus, each bit of a 4-bit parameter is held in one of the four registers. In a similar fashion, the hamming code holding unit 31 also includes three registers each capable of holding a single bit. Thus, each bit of the 3-bit redundancy bit is held in one of the three registers.

The error detecting unit 32 includes three XOR circuits $200_1$ to $200_3$ each having four inputs, and includes an OR circuit 203 having three inputs to which the output of the XOR circuits $200_1$ to $200_3$ is input. Regarding each of the XOR circuits $200_1$ to $200_3$, the four inputs are connected in a predetermined manner to the bits of the parameter holding unit 12 and the bits of the hamming code holding unit 31. Moreover, the XOR circuits $200_1$ to $200_3$ output syndrome bits $S_0$, $S_1$, and $S_2$, respectively.

The output of the OR circuit 203 is retrieved as an error detection signal. That is, when all of the syndrome bits $S_0$, $S_1$, and $S_2$ have the value "0", the output of the OR circuit 203 becomes "0" thereby indicating that no error was detected. In contrast, if even one of the syndrome bits $S_0$, $S_1$, and $S_2$ has the value "1", the output of the OR circuit 203 becomes "1" thereby indicating that an error was detected.

The error correcting unit 33 includes seven XOR circuits $202_1$ to $202_7$ each having two inputs, and includes seven AND circuits $201_1$ to $201_7$ each having three inputs. Each output of the XOR circuits $200_1$ to $200_3$ is connected to one terminal of each of the AND circuits $201_1$ to $201_7$. Each of the AND circuits $201_1$ to $201_7$ has three inputs, with the combination of inverted and non-inverted inputs for each AND circuit being different. In outputs $e_0, e_1, \ldots, e_7$ of the AND circuits $201_1$ to $201_7$, respectively; when the error is a 1-bit error, the output corresponding to that error position has the value "1".

Each of the XOR circuits $202_1$ to $202_7$ performs XOR of each bit of the parameter holding unit 12 and each bit of the hamming code holding unit 31 with the output of each of the AND circuits $201_1$ to $201_7$. In each of the XOR circuits $202_1$ to $202_7$; from among the bits of the parameter holding unit 12 and the bits of the hamming code holding unit 31, the bits having the value "1" among the output of the AND circuits $201_1$ to $201_7$ are inverted for error correction.

From each of the XOR circuits $202_1$ to $202_7$ is output the parameters subjected to error correction and an error code. The parameters subjected to error correction are then sent to the encoding unit 10. Moreover, the output of each of the XOR circuits $202_1$ to $202_7$ is held in the bits of the parameter holding unit 12 and in the bits of the hamming code holding unit 31; and error correction is also performed with respect to the contents held in the parameter holding unit 12 and the hamming code holding unit 31.

In this way, in the case of performing error detection and error correction using the hamming code, the error detecting unit 32 and the error correcting unit 33 can be configured only with combinational circuits such as AND circuits, inverters, and XOR circuits. As a known fact, in a combinational circuit, the output is determined according to the state of the input. Hence, it becomes possible to perform error detection and error correction almost simultaneously with outputting an error detection signal.

Fifth Embodiment

Figure 12:
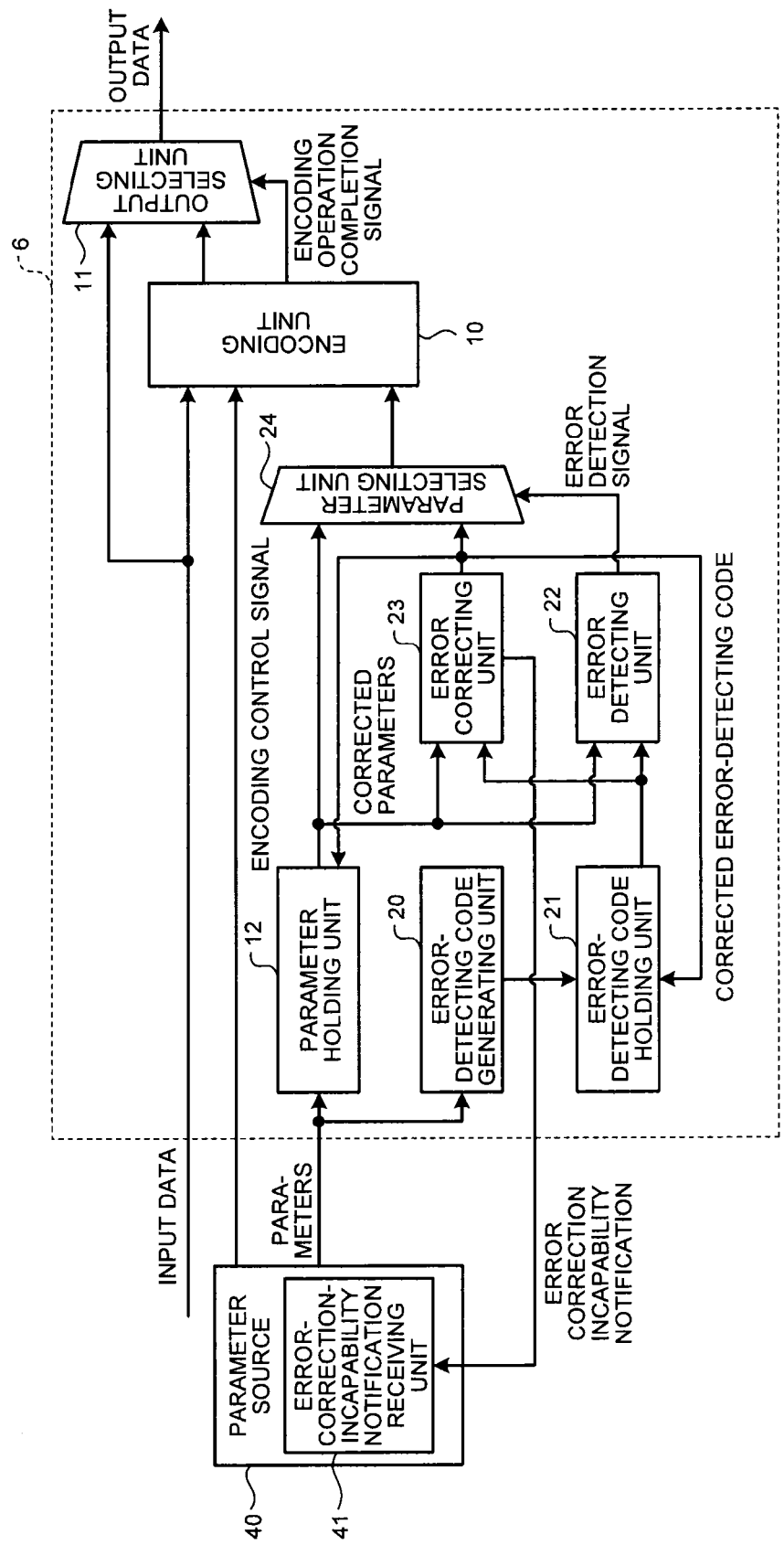
FIG. 12 is a block diagram illustrating an exemplary configuration of an encoding apparatus according to a fifth embodiment.

Given below is the explanation of the fifth embodiment. FIG. 12 illustrates an exemplary configuration of an encoding apparatus 6 according to the fifth embodiment. With reference to FIG. 12, the constituent elements identical to those illustrated in FIG. 7 are referred to by the same reference numerals, and the detailed explanation thereof is not repeated. As far as the constituent elements are concerned, the encoding apparatus 6 is substantially identical to the encoding apparatus 4 explained with reference to FIG. 7.

In the encoding apparatus 6, an error correction incapability notification that is output by the error correcting unit 23 is sent to a parameter source 40 that sends parameters to the parameter holding unit 12. As illustrated in FIG. 12, the parameter source 40 includes an error-correction-incapability notification receiving unit 41 that receives error correction incapability notifications output by the error correcting unit 23.

When the error-correction-incapability notification receiving unit 41 receives an error correction incapability notification; the parameter source 40 sends parameters, which are to be used in the encoding operation by the encoding unit 10, to the encoding apparatus 6. Those parameters are sent to the parameter holding unit 12 and are held therein by overwriting the already-held parameters. In another words, the parameters that were held in the parameter holding unit 12 are initialized by the parameters sent by the parameter source 40.

The parameters sent by the parameter source 40 to the encoding apparatus 6 are also sent to the error-detecting code generating unit 20. With the use of the parameters sent by the parameter source 40, the error-detecting code generating unit 20 generates an error-detecting code. Then, that error-detecting code is sent to the error-detecting code holding unit 21 and held therein by overwriting the already-held error-detecting code. In another words, the error-detecting code that was held in the error-detecting code holding unit 21 is initialized by the error-detecting code sent by the parameter source 40.

Meanwhile, when the error-correction-incapability notification receiving unit 41 receives an error correction incapability notification, the parameter source 40 also sends an encoding control signal to the encoding apparatus 6. The encoding control signal is then fed to the encoding unit 10. Upon receiving the encoding control signal, the encoding unit 10 discontinues the encoding operation.

Figure 13:
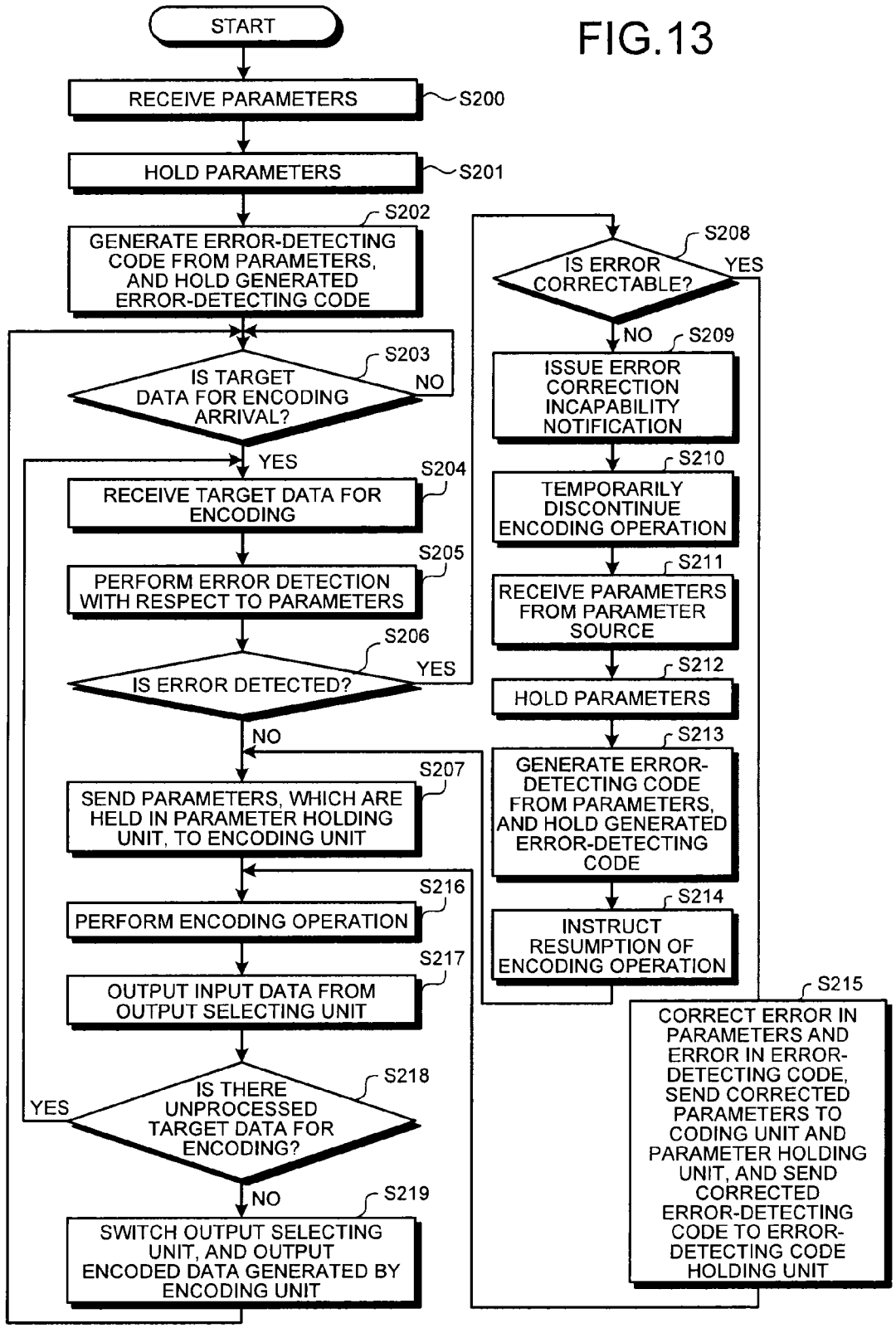
FIG. 13 is a flowchart for explaining exemplary operations performed in the encoding apparatus according to the fifth embodiment.

FIG. 13 is a flowchart for explaining exemplary operations performed in the encoding apparatus 6 according to the fifth embodiment. When the encoding apparatus is switched ON, the parameter source 40 sends parameters, which are to be used in the encoding operation performed by the encoding unit 10, to the encoding apparatus 6 (Step S200). The parameters sent by the parameter source 40 are held in the parameter holding unit 12 as well as sent to the error-detecting code generating unit 20 (Step S201). Then, the error-detecting code generating unit 20 generates an error-detecting code with the use of the received parameters and stores the error-detecting code in the error-detecting code holding unit 21 (Step S202).

Subsequently, the encoding apparatus 6 waits for the input of input data that is the target data for encoding (Step S203). Upon receiving the target data for encoding, the encoding apparatus 6 sends the target data for encoding to the encoding unit 10 as well as to the first selection input terminal of the output selecting unit 11 (Step S204).

Then, the error detecting unit 22 makes use of the error-detecting code held in the error-detecting code holding unit 21 and performs error detection with respect to the parameters held in the parameter holding unit 12 (Step S205). Based on the result of error detection, the error detecting unit 22 determines whether or not an error is detected (Step S206).

If it is determined that no error is detected (No at Step S206), then the error detecting unit 22 outputs an error detection signal indicating the absence of any error to the parameter selecting unit 24, and the system control proceeds to Step S207. In accordance with the error detection signal sent by the error detecting unit 22, the parameter selecting unit 24 selects the first selection input terminal. Then, the parameters held in the parameter holding unit 12 are sent to the encoding unit 10 via the parameter selecting unit 24 (Step S207).

Meanwhile, if it is determined that an error is detected (Yes at Step S206), then the error detecting unit 22 outputs an error detection signal indicating the presence of an error to the parameter selecting unit 24, and the system control proceeds to Step S208. In accordance with the error detection signal sent by the error detecting unit 22, the parameter selecting unit 24 selects the second selection input terminal.

Then, based on the error detection result obtained by the error detecting unit 22 at Step S205, the error correcting unit 23 determines whether or not the detected error can be corrected with the error correcting capability of the error-detecting code (the error-detecting/error-correcting code) (Step S208).

If it is determined that the detected error cannot be corrected with the error correcting capability of the error-detecting code (No at Step S208), then the system control proceeds to Step S209. Subsequently, the error correcting unit 23 outputs an error correction incapability notification indicating that the detected error cannot be corrected (Step S209).

The error correction incapability notification output by the error correcting unit 23 is received by the error-correction-incapability notification receiving unit 41 of the parameter source 40 (Step S210). Once the error-correction-incapability notification receiving unit 41 receives the error correction incapability notification, the parameter source 40 outputs an encoding control signal for temporarily discontinuing the encoding operation being performed by the encoding unit 10. The encoding apparatus 6 receives the encoding control signal and inputs it to the encoding unit 10. Upon receiving the encoding control signal, the encoding unit 10 temporarily discontinues the encoding operation.

Subsequently, to the encoding apparatus 6, the parameter source 40 sends parameters to be used in the encoding operation by the encoding unit 10 (Step S211). Those parameters are held in the parameter holding unit 12 as well as sent to the error-detecting code generating unit 20 (Step S212). Then, the error-detecting code generating unit 20 generates an error-detecting code with the use of the parameters and stores the error-detecting code in the error-detecting code holding unit 21 (Step S213).

Upon sending the parameters to the encoding apparatus 6, the parameter source 40 outputs an encoding control signal for resuming the encoding operation that was being performed by the encoding unit 10 (Step S214). The parameter source 40 can output the encoding controlling signal after receiving a parameter reception notification from the parameter holding unit 12 or the error-detecting code generating unit 20. When the encoding unit 10 receives the encoding control signal, it resumes the encoding operation. Once the encoding operation is resumed, the system control proceeds to Step S207 described above.

Meanwhile, if it is determined that the detected error can be corrected with the error correcting capability of the error-detecting code (Yes at Step S208), then the system control proceeds to Step S215. Subsequently, the error correcting unit 23 makes use of the error-detecting code held in the error-detecting code holding unit 21 and performs error correction with respect to the parameters held in the parameter holding unit 12 and with respect to the error-detecting code. The parameters that are subjected to error correction are then sent to the encoding unit 10 via the parameter selecting unit 24 as well as sent to the parameter holding unit 12 and held therein by overwriting the already-held parameters. Similarly, the error-detecting code that is subjected to error correction is sent to the error-detecting code holding unit 21 and held therein by overwriting the already-held error-detecting code (Step S215).

Once the operation at Step S214 or Step S215 is completed, the system control proceeds to Step S216. Then, the encoding unit 10 makes use of the parameters sent by the parameter selecting unit 24 and encodes the target data for encoding that has been received at Step S204 (Step S216). At this stage, in the output selecting unit 11, since the first selection input terminal is selected; the target data for encoding is output without modification as output data (Step S217).

Then, the encoding apparatus 6 determines whether or not any target data for encoding still remains unprocessed (Step S218). If it is determined that there still remains some target data for encoding (Yes at Step S218), then the system control returns to Step S204 and the operations are repeated with respect to the remaining target data for encoding.

On the other hand, if it is determined that no target data for encoding remains unprocessed (No at Step S218), then the system control proceeds to Step S219. Subsequently, the encoding unit 10 outputs an encoding operation completion signal, which indicates that a predetermined volume of target data for encoding has been encoded, to the output selecting unit 11. In accordance with the encoding operation completion signal, the output selecting unit 11 switches the input terminal from the first selection input terminal to the second selection input terminal and outputs the encoded data, which is obtained as a result of encoding performed by the encoding unit 10 with respect to the target data for encoding, as output data (Step S219). Then, the system control returns to Step S203.

In this way, in the encoding apparatus 6, even when an error is detected that is beyond the error correcting capability, the parameters held in the parameter holding unit 12 can be initialized. That enables achieving enhancement in the reliability.

Meanwhile, in the fifth embodiment too, if an error is detected in the parameters (Yes at Step S206); then, as explained in the first modification example of the first embodiment, the error correction performed with respect to parameters at Step S215 can be preceded by discontinuation of the encoding operation and followed by resumption of the encoding operation. Similarly, if an error is detected in the parameters (Yes at Step S206); then, as explained in the second modification example of the first embodiment, the error correction performed with respect to parameters at Step S215 can be followed by requesting the source of sending the target data for encoding to resend the target data for encoding. Then, the system control can return to Step S203 to wait for the arrival of the requested target data for encoding.

Modification Example of Fifth Embodiment

The explanation given above is regarding the example of an error-detecting code having error correcting capability. However, that is not the only possible case. In a modification example of the fifth embodiment, the explanation is given for an example of using an error-detecting code such as the parity bit or the CRC code that does not have any error correcting capability. In such a case, if error detection is performed with respect to the parameters using the error-detecting code and if an error is detected, then the encoding operation is temporarily discontinued. Subsequently, the parameter source is instructed to send parameters, with which the parameters that were held in the parameter holding unit 12 are initialized. After that, the encoding operation is resumed.

Figure 14:
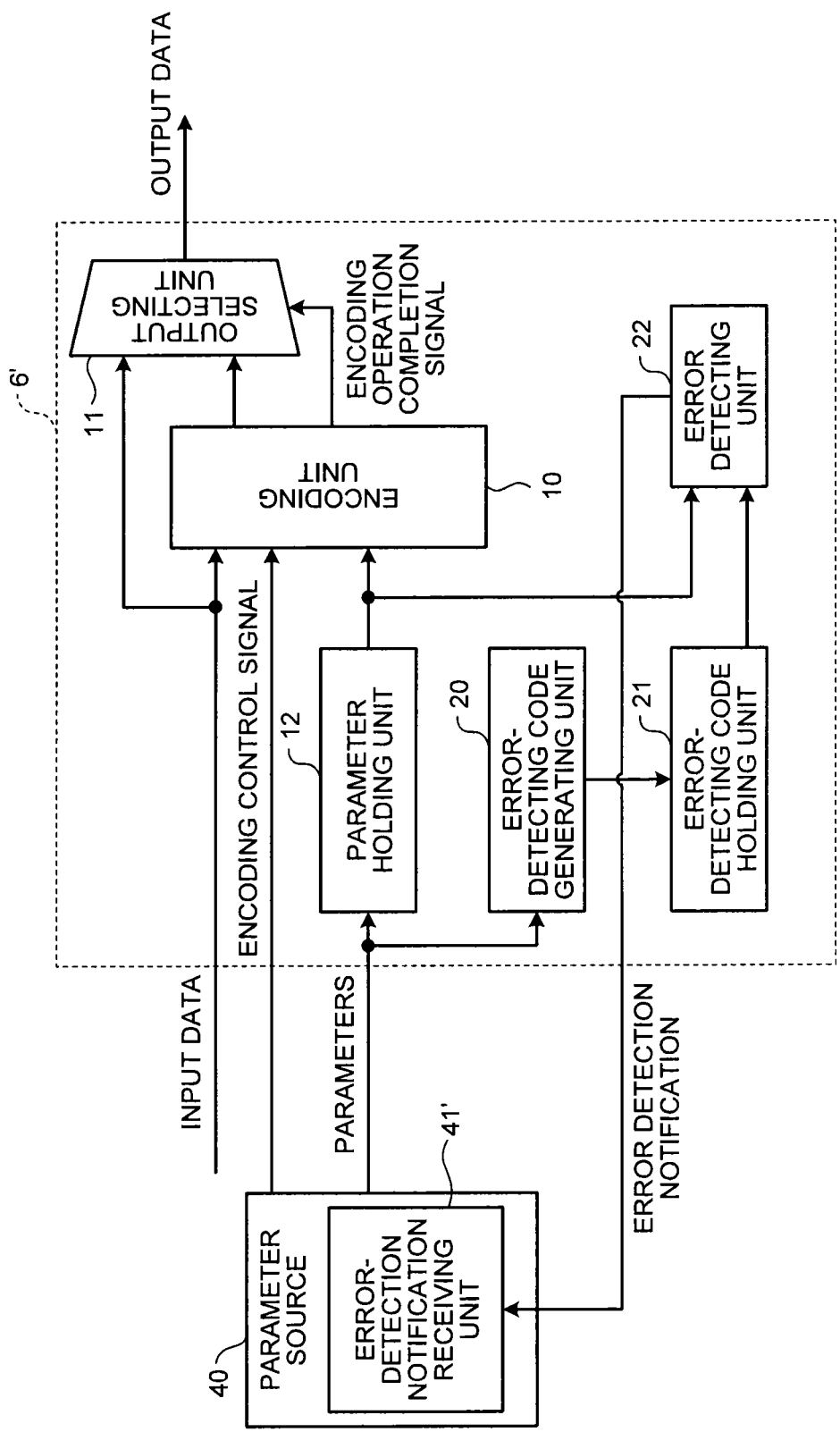
FIG. 14 is a block diagram illustrating an exemplary configuration of an encoding apparatus according to a modification example of the fifth embodiment.

FIG. 14 illustrates an exemplary configuration of an encoding apparatus 6' according to the modification example of the fifth embodiment. With reference to FIG. 14, the constituent elements identical to those illustrated in FIG. 12 are referred to by the same reference numerals, and the detailed explanation thereof is not repeated. Since the encoding apparatus 6' is configured to not perform error correction, the error correcting unit 23 and the parameter selecting unit 24 that are related to error correction in the encoding apparatus 6 are absent in the encoding apparatus 6'. Moreover, in FIG. 14, the error-correction-incapability notification receiving unit 41 illustrated in FIG. 12 is replaced with an error detection notification receiving unit 41'.

Thus, in the encoding apparatus 6', the parameters held in the parameter holding unit 12 are directly sent to the encoding unit 10. Moreover, with respect to the parameters held in the parameter holding unit 12, the error detecting unit 22 performs error detection with the use of the error-detecting code that is held in the error-detecting code holding unit 21. When an error is detected, the error detecting unit 22 sends an error detection notification to the parameter source 40.

When the error detection notification receiving unit 41' receives the error detection notification, the parameter source 40 sends an encoding control signal for temporarily discontinuing the encoding operation being performed by the encoding unit 10 as well as sends parameters to the encoding apparatus 6'.

Figure 15:
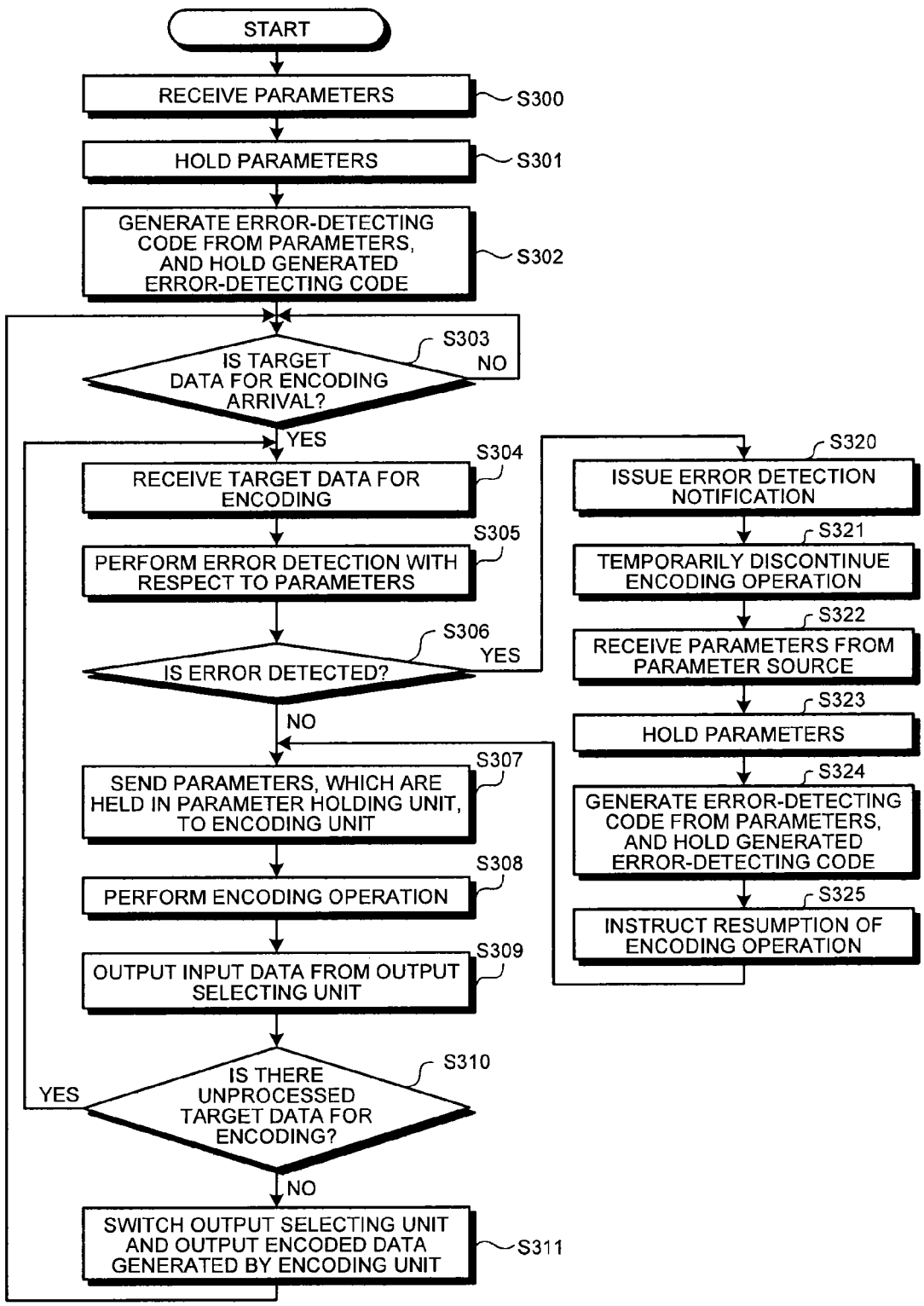
FIG. 15 is a flowchart for explaining exemplary operations performed in the encoding apparatus according to the modification example of the fifth embodiment.

FIG. 15 is a flowchart for explaining exemplary operations performed in the encoding apparatus 6' according to the modification example of the fifth embodiment. When the encoding apparatus 6' is switched ON; the parameter source 40 sends parameters, which are to be used in the encoding operation by the encoding unit 10, to the encoding apparatus 6' (Step S300). Those parameters are held in the parameter holding unit 12 as well as sent to the error-detecting code generating unit 20 (Step S301). Then, the error-detecting code generating unit 20 generates an error-detecting code with the use of the received parameters and stores the error-detecting code in the error-detecting code holding unit 21 (Step S302).

Subsequently, the encoding apparatus 6' waits for the input of input data that is the target data for encoding (Step S303). Upon receiving the target data for encoding, the encoding apparatus 6' sends the target data for encoding to the encoding unit 10 as well as to the first selection input terminal of the output selecting unit 11 (Step S304).

Then, the error detecting unit 22 makes use of the error-detecting code held in the error-detecting code holding unit 21 and performs error detection with respect to the parameters held in the parameter holding unit 12 (Step S305). Based on the result of error detection, the error detecting unit 22 determines whether or not an error is detected (Step S306). If it is determined that no error is detected in the parameters (No at Step S306), then the system control proceeds to Step S307 and the parameters held in the parameter holding unit 12 are sent to the encoding unit 10 (Step S307).

Meanwhile, if it is determined that an error is detected in the parameters (Yes at Step S306), then the system control proceeds to Step S320 and the error detecting unit 22 outputs an error detection notification indicating that an error was detected (Step S320). The error detection notification output by the error detecting unit 22 is received by the error detection notification receiving unit 41' in the parameter source 40.

Once the error detection notification receiving unit 41' receives the error detection notification, the parameter source 40 outputs an encoding control signal for temporarily discontinuing the encoding operation being performed by the encoding unit 10. The encoding apparatus 6' receives that encoding control signal and inputs it to the encoding unit 10. Upon receiving the encoding control signal, the encoding unit 10 temporarily discontinues the encoding operation (Step S321).

Subsequently, to the encoding apparatus 6', the parameter source 40 sends parameters to be used in the encoding operation by the encoding unit 10 (Step S322). Those parameters are held in the parameter holding unit 12 as well as sent to the error-detecting code generating unit 20 (Step S323). If an error was detected in the parameters already held in the parameter holding unit 12, then error correction is performed by overwriting the already-held parameters with the new parameters sent by the parameter source 40.

Then, the error-detecting code generating unit 20 generates an error-detecting code with the use of the newly-sent parameters and stores the error-detecting code in the error-detecting code holding unit 21 (Step S324). If an error was detected in the error detecting code already held in the error-detecting code holding unit 21, then error correction is performed by overwriting the already-held error-detecting code with the error-detecting code that is generated with the use of the new parameters sent by the parameter source 40.

Upon sending the parameters to the encoding apparatus 6', the parameter source 40 outputs an encoding control signal for resuming the encoding operation that was being performed by the encoding unit 10 (Step S325). The parameter source 40 can output the encoding controlling signal after receiving a parameter reception notification from the parameter holding unit 12 or the error-detecting code generating unit 20. When the encoding unit 10 receives the encoding control signal, it resumes the encoding operation.

Once the encoding operation is resumed, the system control proceeds to Step S307 described above, and the parameters held in the parameter holding unit 12 are sent to the encoding unit 10 (Step S307).

When the parameters are sent to the encoding unit 10, the system control proceeds to Step S308; and the encoding unit 10 encodes the target data for encoding, which was received at Step S304, with the use of the parameters received from the parameter holding unit 12 (Step S308). At that time, the target data for encoding is output without modification as output data by the output selecting unit 11 (Step S309).

Then, the encoding apparatus 6' determines whether or not any target data for encoding still remains unprocessed (Step S310). If it is determined that there still remains some target data for encoding (Yes at Step S310), then the system control returns to Step S304 and the operations are repeated with respect to the remaining target data for encoding.

On the other hand, if it is determined that no target data for encoding remains unprocessed (No at Step S310), then the system control proceeds to Step S311. Subsequently, the encoding unit 10 outputs an encoding operation completion signal, which indicates that a predetermined volume of target data for encoding has been encoded, to the output selecting unit 11. In accordance with that encoding operation completion signal, the output selecting unit 11 switches the input terminal from the first selection input terminal to the second selection input terminal and outputs the encoded data, which is obtained as a result of encoding performed by the encoding unit 10 with respect to the target data for encoding, as output data (Step S311). Then, the system control returns to Step S303.

In this way, in the encoding apparatus 6', when an error is detected as the result of performing error detection, the parameters held in the parameter holding unit 12 can be initialized. That enables achieving a high degree of reliability with a simple configuration.

Sixth Embodiment

Explained below is the sixth embodiment of an exemplary memory system in which a memory element is connected to the output of the output selecting unit 11 of any one of the encoding apparatus 2 according to the first embodiment to the encoding apparatus 6 according to the fifth embodiment. With that, the target data for encoding as well as the encoded data output by the output selecting unit 11 is stored in the memory element.

Figure 16:
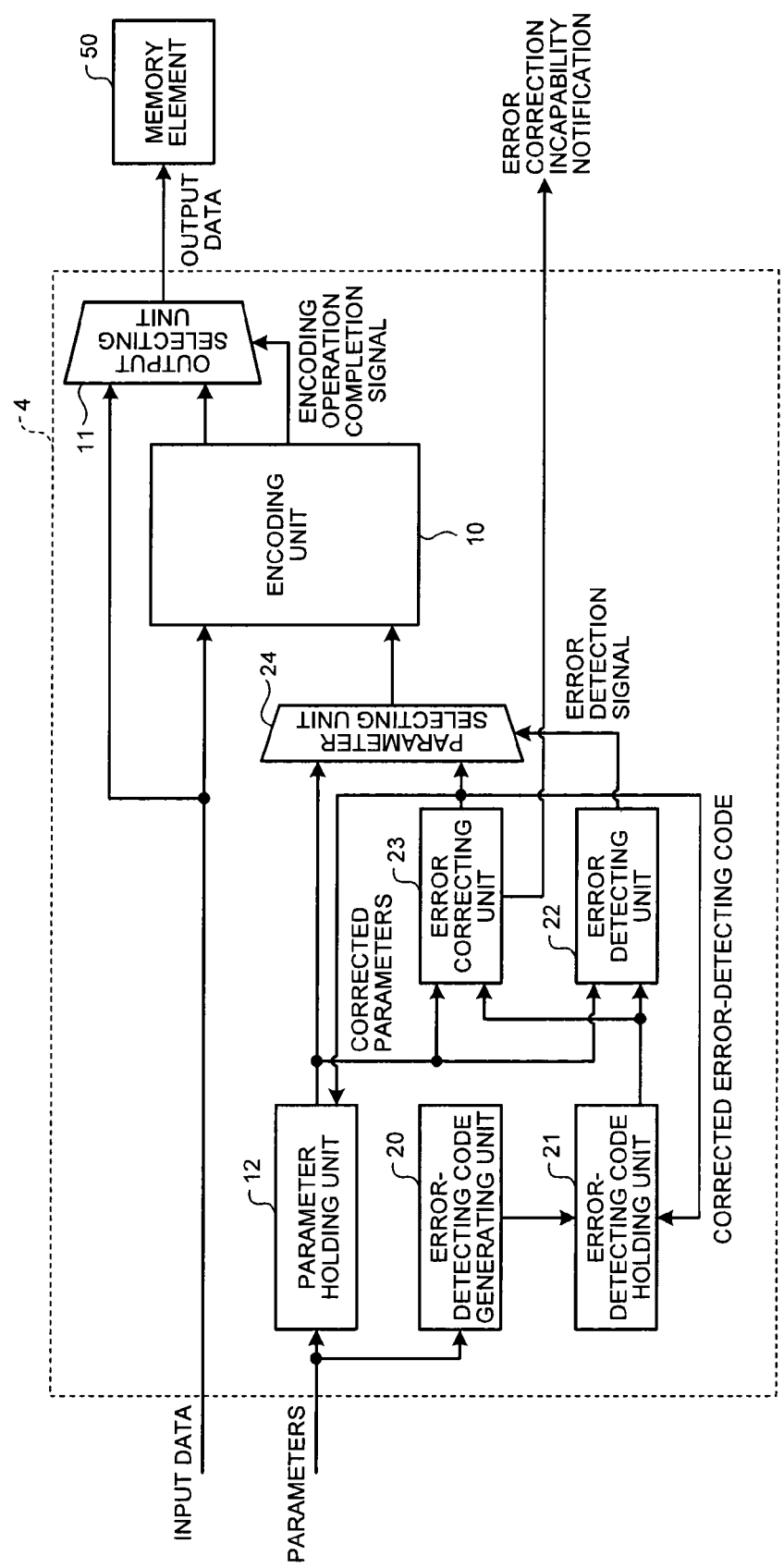
FIG. 16 is a block diagram illustrating an exemplary configuration of a memory system according to a sixth embodiment.

FIG. 16 illustrates an exemplary configuration of the memory system according to the sixth embodiment. In FIG. 16 is illustrated an example of a memory system that is configured by connecting a memory element 50 to the encoding apparatus 4 explained with reference to FIG. 7. Herein, for example, the memory system not only stores data, which is received from an external device such as an information processing apparatus, in the memory element 50; but also performs an encoding operation with respect to the data and stores the encoded data, which is generated as a result of the encoding operation, in the memory element 50 in a corresponding manner to the received data. Meanwhile, in FIG. 16, the constituent elements identical to those illustrated in FIG. 7 are referred to by the same reference numerals, and the detailed explanation thereof is not repeated.

The memory element 50 is connected to the output of the output selecting unit 11. Thus, the target data for encoding as well as the encoded data output by the output selecting unit 11 is stored in the memory element 50. As long as the memory element 50 that is connected to the output of the output selecting unit 11 is a data-writable memory element, it is not limited to any particular type. For example, a semiconductor memory such as a DRAM (dynamic random access memory) or a NAND flash memory can be used as the memory element 50.

Figure 17:
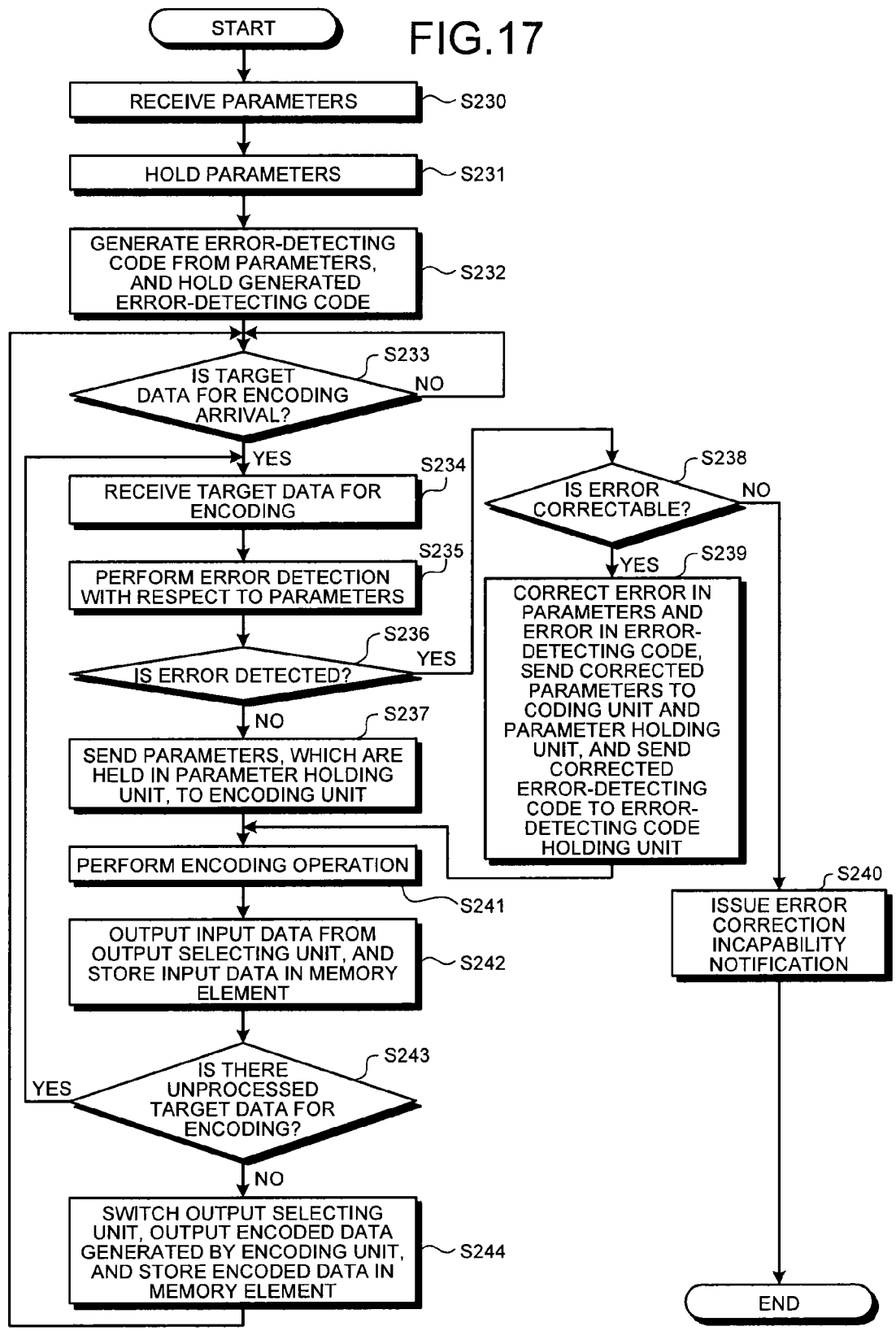
FIG. 17 is a flowchart for explaining exemplary operations performed in the memory system according to the sixth embodiment.

FIG. 17 is a flowchart for explaining exemplary operations performed in the memory system according to the sixth embodiment. In the flowchart illustrated in FIG. 17, except for the operations performed at Step S242 and Step S244 for storing the target data for encoding output by the output selecting unit 11 in the memory element 50 and storing the encoded data output by the output selecting unit 11 in the memory element 50, the other operations are substantially identical to the operations performed in the encoding apparatus 4 as explained with reference to the flowchart illustrated in FIG. 8.

With reference to FIG. 17, when the memory system is switched ON, the parameters are received from outside (Step S230) and are held in the parameter holding unit 12 as well as sent to the error-detecting code generating unit 20 (Step S231). Then, the error-detecting code generating unit 20 generates an error-detecting code with the use of the received parameters and stores the error-detecting code in the error-detecting code holding unit 21 (Step S232).

Subsequently, the encoding apparatus 4 waits for the input of input data that is the target data for encoding sent by, for example, an external information processing apparatus (Step S233). Upon receiving the target data for encoding, the encoding apparatus 4 sends that target data for encoding to the encoding unit 10 as well as to the first selection input terminal of the output selecting unit 11 (Step S234).

Then, the error detecting unit 22 makes use of the error-detecting code held in the error-detecting code holding unit 21 and performs error detection with respect to the parameters held in the parameter holding unit 12 (Step S235). Based on the result of error detection, the error detecting unit 22 determines whether or not an error is detected (Step S236).

If it is determined that no error is detected (No at Step S236), then the error detecting unit 22 outputs an error detection signal indicating the absence of any error to the parameter selecting unit 24, and the system control proceeds to Step S237. In accordance with the error detection signal sent by the error detecting unit 22, the parameter selecting unit 24 selects the first selection input terminal. Then, the parameters held in the parameter holding unit 12 are sent to the encoding unit 10 via the parameter selecting unit 24 (Step S237).

Meanwhile, if it is determined that an error is detected (Yes at Step S236), then the error detecting unit 22 outputs an error detection signal indicating the presence of an error to the parameter selecting unit 24, and the system control proceeds to Step S238. In accordance with the error detection signal sent by the error detecting unit 22, the parameter selecting unit 24 selects the second selection input terminal.

Then, based on the error detection result obtained by the error detecting unit 22 at Step S235, the error correcting unit 23 determines whether or not the detected error can be corrected with the error correcting capability of the error-detecting code (the error-detecting/error-correcting code) (Step S238).

If it is determined that the detected error can be corrected with the error correcting capability of the error-detecting code (Yes at Step S238), then the system control proceeds to Step S239. Subsequently, the error correcting unit 23 makes use of the error-detecting code held in the error-detecting code holding unit 21 as well as makes use of the parameters held in the parameter holding unit 12, and performs error correction. The parameters that are subjected to error correction are then sent to the encoding unit 10 via the parameter selecting unit 24 as well as sent to the parameter holding unit 12 and held therein by overwriting the already-held parameters. Similarly, the error-detecting code that is subjected to error correction is sent to the error-detecting code holding unit 21 and held therein by overwriting the already-held error-detecting code (Step S239).

Once the operation at Step S237 or Step S239 is completed, the system control proceeds to Step S241. Then, the encoding unit 10 makes use of the parameters sent by the parameter selecting unit 24 and encodes the target data for encoding that has been received at Step S234 (Step S241). At this stage, in the output selecting unit 11, the first selection input terminal is selected; and the target data for encoding is output without modification as output data (Step S242). The target data for encoding that is output by the output selecting unit 11 is sent to and stored in the memory element 50.

Then, the encoding apparatus 4 determines whether or not any target data for encoding still remains unprocessed (Step S243). If it is determined that there still remains some target data for encoding (Yes at Step S243), then the system control returns to Step S234 and the operations are repeated with respect to the remaining target data for encoding.

On the other hand, if it is determined that no target data for encoding remains unprocessed (No at Step S243), then the system control proceeds to Step S244. Subsequently, the encoding unit 10 outputs an encoding operation completion signal, which indicates that a predetermined volume of target data for encoding has been encoded, to the output selecting unit 11. In accordance with that encoding operation completion signal, the output selecting unit 11 switches the input terminal from the first selection input terminal to the second selection input terminal and outputs the encoded data, which is obtained as a result of encoding performed by the encoding unit 10 with respect to the target data for encoding, as output data. That encoded data output by the output selecting unit 11 is sent to and stored in the memory element 50 (Step S244). Then, the system control returns to Step S233.

Meanwhile, if it is determined that the detected error cannot be corrected with the error correcting capability of the error-detecting code (No at Step S238), then the system control proceeds to Step S240. Subsequently, the error correcting unit 23 outputs an error correction incapability notification, which indicates that the detected error cannot be corrected to, for example, the information processing apparatus that is the source of the target data for encoding (Step S240). That marks the end of the operations explained with reference to FIG. 17. For example, as soon as an error correction incapability notification is output at Step S240, the encoding operation performed by the encoding unit 10 is terminated and it is ensured that the encoded data does not get output from the encoding apparatus 4.

In this way, in the memory system according to the sixth embodiment, error detection and error correction are performed with respect to the parameters that are used in the encoding operation performed by the encoding unit 10, and then the parameters are sent to the encoding unit 10. Every time an error is detected in the parameters, that error is corrected before overwriting the parameters already held in the parameter holding unit 12 with the parameters subjected to error correction. That enables achieving enhancement not only in the reliability of the encoded data but also in the reliability of the data stored in the memory element 50.

Meanwhile, in the sixth embodiment too, if an error is detected in the parameters (Yes at Step S236); then, as explained in the first modification example of the first embodiment, the error correction performed with respect to parameters at Step S239 can be preceded by discontinuation of the encoding operation and followed by resumption of the encoding operation.

Similarly, if an error is detected in the parameters (Yes at Step S236); then, as explained in the second modification example of the first embodiment, the error correction performed with respect to parameters at Step S239 can be followed by requesting the source of sending the target data for encoding to resend the target data for encoding. Then, the system control can return to Step S233 to wait for the arrival of the requested target data for encoding. This is particularly desirable when the memory element 50 is, for example, a NAND flash memory.

Seventh Embodiment

Figure 18:
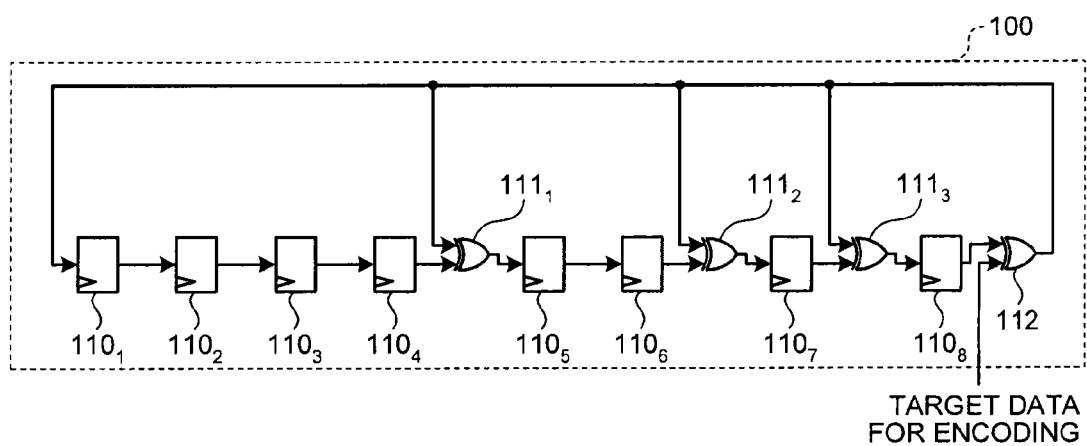
FIG. 18 is an outlined line drawing that illustrates in principle an encoding apparatus in which a generating polynomial is used.

Given below is the explanation of the seventh embodiment. In the seventh embodiment, a more specific explanation is given regarding the example when a generating polynomial is used in the encoding unit 10. Firstly, explained below in principle is an encoding apparatus 100 in which a generating polynomial is used. FIG. 18 illustrates an example of the encoding apparatus 100 when the generating polynomial $G(x)$ is $x^8+x^7+x^6+x^4+1$.

The encoding apparatus 100 includes registers $110_1$, $110_2$, ..., and $110_8$ that are equal in number to the maximal degree of the generating polynomial $G(x)$; as well as includes XOR circuits $111_1$, $111_2$, and $111_3$ that are disposed at the output of the registers of such degrees of the generating polynomial $G(x)$ that have "1" as the coefficient. Thus, the encoding apparatus 100 constitutes a shift register having a cyclic structure. The target data for encoding is input bit-by-bit to an XOR circuit 112 and is subjected to XOR with the output of the register $110_8$. The result thereof is input to each of the XOR circuits $111_1$, $111_2$, and $111_3$; and is circulated to each of the registers $110_1$, $110_2$, ..., and $110_8$.

In each of the registers $110_1$, $110_2$, ..., and $110_8$ is held a value of an intermediate result of encoding. Once a predetermined volume of target data for encoding is input, the encoding output is retrieved from each of the registers $110_1$, $110_2$, ..., and $110_8$.

The encoding apparatus 100 is configured specifically for the generating polynomial $G(x)=x^8+x^7+x^6+x^4+1$ in such a way that the relationship of the registers $110_1$, $110_2$, ..., and $110_8$ with the XOR circuits $111_1$, $111_2$, $111_3$, and $111_4$ is standardized according to the generating polynomial $G(x)$. Thus, when it is required to configure an encoding apparatus corresponding to another generating polynomial $G(x)$, it becomes necessary to design a separate circuit.

Figure 19:
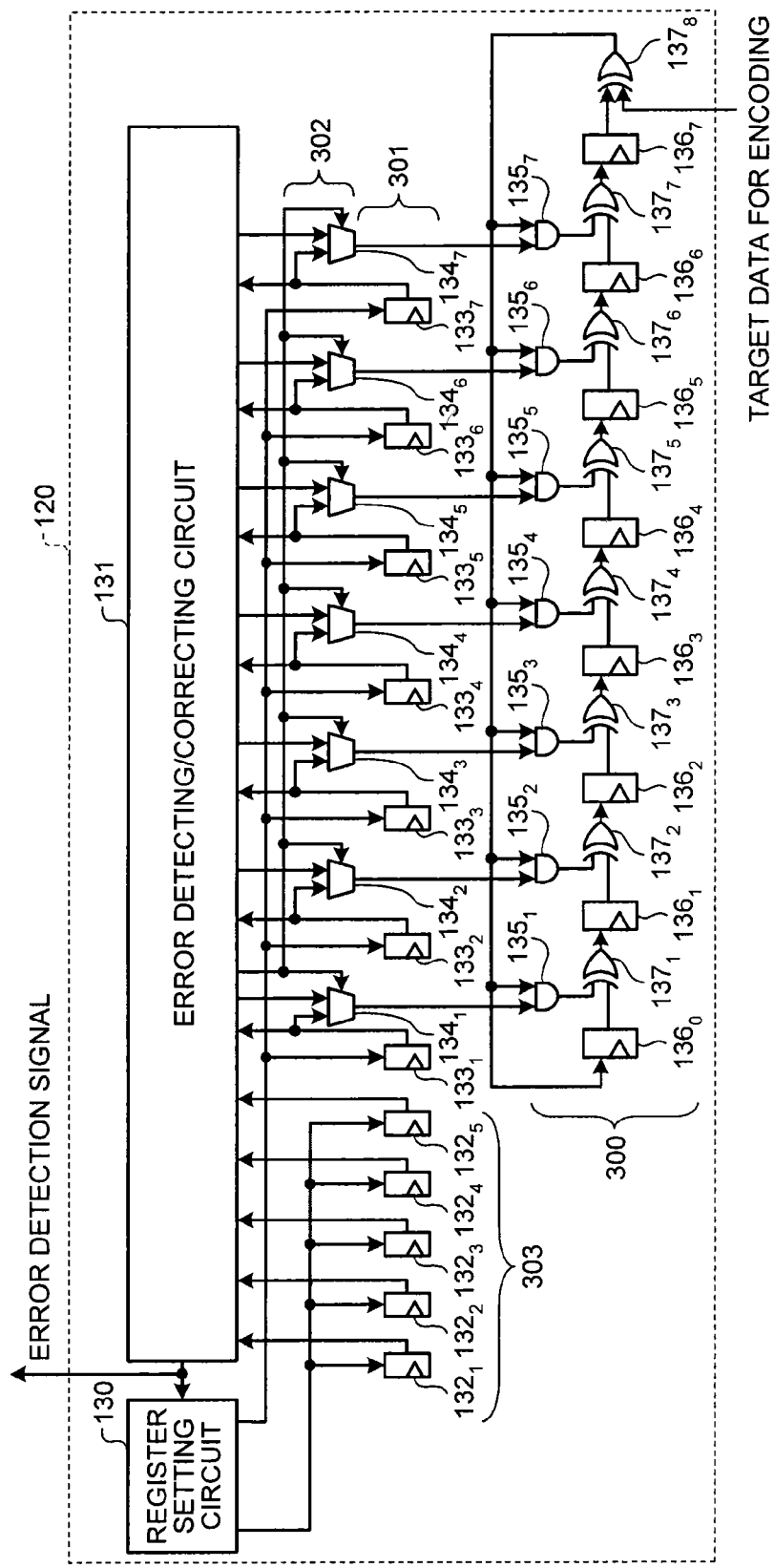
FIG. 19 is a block diagram illustrating an exemplary configuration of an encoding apparatus according to a seventh embodiment.

FIG. 19 illustrates an exemplary configuration of an encoding apparatus 120 according to the seventh embodiment. In the encoding apparatus 120, different generating polynomials $G(x)$ can be implemented according to parameter settings, and error detection and error correction can be performed with respect to the parameters. Meanwhile, herein, it is assumed that the encoding apparatus 120 performs encoding using the BCH code and has the maximal degree of "8".

In FIG. 19, the encoding apparatus 120 includes a register setting circuit 130, an error detecting/correcting circuit 131, an encoding unit 300, a parameter holding unit 301, a parameter selecting unit 302, and an error-detecting code holding unit 303. Of these constituent elements, the error detecting/correcting circuit 131 has the functions of, for example, the error detecting unit 22 and the error correcting unit 23 illustrated in FIG. 3. The encoding unit 300, the parameter holding unit 301, the parameter selecting unit 302, and the error-detecting code holding unit 303 respectively correspond to, for example, the encoding unit 10, the parameter holding unit 12, the parameter selecting unit 24, and the error-detecting code holding unit 21 illustrated in FIG. 3.

The encoding unit 300 includes registers $136_0$, $136_1$, ..., and $136_7$ that are equal in number to the maximal degree (in this example, "8"); includes XOR circuits $137_1$, $137_2$, ..., and $137_8$ disposed in between the registers $136_0$, $136_1$, ..., and $136_7$; and includes AND circuits $135_1$, $135_2$, ..., and $135_7$ used to set validity/invalidity for the XOR circuits $137_1$, $137_2$, ..., and $137_7$ but not for the XOR circuit $137_8$. Thus, the encoding unit 300 constitutes a shift register having a cyclic structure.

The target data for encoding is input to the XOR circuit $137_8$ and is subjected to XOR with the output of the register $136_7$. The result of XOR is input to the first input terminal of each of the AND circuits $135_1$, $135_2$, ..., and $135_7$. The outputs of the AND circuits $135_1$, $135_2$, ..., and $135_7$ are respectively sent to the XOR circuits $137_1$, $137_2$, ..., and $137_7$. At that time, of the AND circuits $135_1$, $135_2$, ..., and $135_7$; when the output of the AND circuits having "0" input at the second input terminal thereof is input to any XOR circuits, then those XOR circuits are considered to be invalid; and the input values appear without modification in the output. In the XOR circuit $137_8$ and in the XOR circuits considered to be valid from among the XOR circuits $137_1$, $137_2$, ..., and $137_7$; the target code for encoding is subjected to XOR with the output of respective previous registers and is then circulated to the registers $136_0$, $136_1$, ..., and $136_7$.

In each of the registers $136_0$, $136_1$, ..., and $136_7$ is held a value of an intermediate result of encoding. Once a predetermined volume of target data for encoding is input, the encoding output is retrieved from each of the registers $136_0$, $136_1$, ..., and $136_7$.

The parameter holding unit 301 includes registers $133_1$, $133_2$, ..., and $133_7$ that are equal in number to the number which is smaller by one than the maximal degree (in this example, the maximal degree is "8", so the number of registers is "7"). The error-detecting code holding unit 303 includes a plurality of registers $132_1$, $132_2$, ..., and $132_5$ for holding the bits of the error-detecting code.

The register setting circuit 130 generates parameters that are held in the registers $133_1$, $133_2$, ..., and $133_7$ of the parameter holding unit 301. Moreover, the register setting circuit 130 includes an error-detecting code generating unit that generates an error-detecting code with the use of the parameters mentioned above. Each parameter generated by the register setting circuit 130 is held in each of the registers $133_1$, $133_2$, ..., and $133_7$. Moreover, each error-detecting code generated by the register setting circuit 130 is held in each of the registers $132_1$, $132_2$, ..., and $132_5$.

The parameter selecting unit 302 includes selectors $134_1$, $134_2$, ..., and $134_7$ that are equal in number to the number which is smaller by one than the maximal degree. To the first selection input terminals of the selectors $134_1$, $134_2$, ..., and $134_7$ are respectively connected the outputs of the registers $133_1$, $133_2$, ..., and $133_7$. To the second selection input terminal of each of the selectors $134_1$, $134_2$, ..., and $134_7$ is input the parameters subjected to error correction corresponding to each degree by the error detecting/correcting circuit 131 and output by the error detecting/correcting circuit 131.

In the encoding unit 300, to one input terminals of the XOR circuits $137_1$, $137_2$, ..., and $137_7$ are respectively connected the outputs of the AND circuits $135_1$, $135_2$, ..., and $135_7$. Meanwhile, since the XOR circuit $137_8$ that corresponds to the maximal degree needs to be always valid, no AND circuit is connected to the XOR circuit $137_8$. Moreover, to one input terminal of each of the AND circuits $135_1$, $135_2$, ..., and $135_7$ is connected the output of the XOR circuit $137_8$ for receiving the target data for encoding. To the other input terminals of the AND circuits $135_1$, $135_2$, ..., and $135_7$ are respectively connected the outputs of the selectors $134_1$, $134_2$, ..., and $134_7$. As parameters to be used, the selectors $134_1$, $134_2$, ..., and $134_7$ either select the parameters held in the registers $133_1$, $133_2$, ..., and $133_7$, respectively; or select the parameters subjected to error correction and output by the error detecting/correcting circuit 131.

According to such a configuration, depending on the outputs of the selectors $134_1$, $134_2$, ..., and $134_7$; it becomes possible to switch between validity/invalidity of the XOR circuits $137_1$, $137_2$, ..., and $137_7$, thereby making it possible to change the configuration of the generating polynomial G(x). Hence, with the values held in the registers $133_1$, $133_2$, ..., and $133_7$ serving as the parameters, the configuration of the generating polynomial can be determined. For example, either "0" or "1" is held in each of the registers $133_1$, $133_2$, ..., and $133_7$; and the generating polynomial is configured with the terms of degrees corresponding to the registers having "1" held therein.

The error detecting/correcting circuit 131 performs error detection and error correction with the use of the parameters held in the registers $133_1$, $133_2$, ..., and $133_7$ of the parameter holding unit 301 and with the use of the error-detecting codes held in the registers $132_1$, $132_2$, ..., and $132_5$. The parameters subjected to error correction as well as the error-correcting code subjected to error correction are sent not only to the registers $133_1$, $133_2$, ..., and $133_7$ but also to the registers $132_1$, $132_2$, ..., and $132_5$, and are held therein by means of overwriting the respective existing data.

While certain embodiments have been described, these embodiments have been presented by ways of examples only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An encoding apparatus, comprising:
   an encoding unit configured to encode input data that is input from outside of the encoding apparatus and to output the encoded data to outside of the encoding apparatus;
   a parameter holding unit configured to hold a first characteristic parameter that is input from outside of the encoding apparatus;
   an error-detecting code holding unit configured to hold an error-detecting code that is generated from the first characteristic parameter;
   an error detecting unit configured to detect an error in a second characteristic parameter that is held in the parameter holding unit, with the use of the error-detecting code held in the error-detecting code holding unit;
   an error correcting unit configured to correct the error detected in the second characteristic parameter by the error detecting unit, thereby generating a third characteristic parameter; and
   a selecting unit configured to
      select the third characteristic parameter when the error detecting unit detects the error in the second characteristic parameter, and
      select the second characteristic parameter, when the error detecting unit detects no error in the second characteristic parameter,
   wherein the encoding unit encodes the input data by performing an encoding process with the use of a characteristic feature determined by a characteristic parameter that is selected by the selecting unit from among the second characteristic parameter and the third characteristic parameter and that is further input to the encoding unit.

2. The apparatus according to claim 1, wherein
   the error detecting unit detects the error by calculating a syndrome with the use of the error-detecting code, and
   the error correcting unit identifies an error position with the use of the syndrome calculated by the error detecting unit, and performs error correction by inverting a value corresponding to the identified error position.

3. The apparatus according to claim 1, wherein
   the first and second characteristic parameters are provided by a parameter providing unit and are held in the parameter holding unit, and
   when the error detecting unit detects the error, the error correcting unit issues a request to the parameter providing unit to provide the second characteristic parameter, and performs error correction with respect to the second characteristic parameter held in the parameter holding unit by storing the second characteristic parameter that is received in response to the request in the parameter holding unit.

4. The apparatus according to claim 1, wherein the error correcting unit stores the error-corrected parameter in the parameter holding unit.

5. The apparatus according to claim 1, further comprising a notifying unit configured to, when the error is beyond the error correcting capability of the error correcting unit, issue a notification about incapability to perform error correction.

6. The apparatus according to claim 5, wherein
the first and second characteristic parameters are provided by a parameter providing unit and are held in the parameter holding unit, and
the notifying unit notifies the parameter providing unit about incapability to perform error correction.

7. The apparatus according to claim 1, wherein
the error correcting unit is configured with a combinational circuit, and
when the error detecting unit detects the error, error correction is performed with respect to the detected error, in a same cycle as a cycle in which the error is detected by the error detecting unit.

8. A memory device, comprising:
an encoding apparatus including
  an encoding unit configured to encode input data that is input from outside of the encoding apparatus and to output the encoded data to outside of the encoding apparatus;
  a parameter holding unit configured to hold a first characteristic parameter that is input from outside of the encoding apparatus;
  an error-detecting code holding unit configured to hold an error-detecting code that is generated from the first characteristic parameter;
  an error detecting unit configured to detect an error in a second characteristic parameter that is held in the parameter holding unit, with the use of the error-detecting code held in the error-detecting code holding unit;
  an error correcting unit configured to correct the error detected in the second characteristic parameter by the error detecting unit, thereby generating a third characteristic parameter;
  a selecting unit configured to
    select the third characteristic parameter when the error detecting unit detects the error in the second characteristic parameter, and
    select the second characteristic parameter, when the error detecting unit detects no error in the second characteristic parameter,
  wherein the encoding unit encodes the input data by performing an encoding process with the use of a characteristic feature determined by a characteristic parameter that is selected by the selecting unit from among the second characteristic parameter and the third characteristic parameter and that is further input to the encoding unit; and
a memory element configured to hold the data that has been encoded by the encoding unit.

9. A control method of an encoding apparatus, comprising:
encoding, by an encoding unit, input data that is input from outside of the encoding apparatus and outputting the encoded data to outside of the encoding apparatus;
holding, by a parameter holding unit, a first characteristic parameter that is input from outside of the encoding apparatus;
detecting, by an error detecting unit, an error in a second characteristic parameter that is held in the parameter holding unit, with the use of an error-detecting code that is held in an error-detecting code holding unit, wherein the error-detecting code is generated from the first characteristic parameter;
correcting, by an error correcting unit, the error detected in the second characteristic parameter at the detecting, thereby generating a third characteristic parameter; and
selecting, by a selecting unit,
  the third characteristic parameter when the error is detected in the second characteristic parameter at the detecting, or
  the second characteristic parameter, when no error is detected in the second characteristic parameter at the detecting,
wherein the encoding includes encoding the input data by performing an encoding process with the use of a characteristic feature determined by a characteristic parameter that is selected at the selecting from among the second characteristic parameter and the third characteristic parameter and that is further input to the encoding unit.

* * * * *